(12) United States Patent
Anvar et al.

(10) Patent No.: US 8,693,279 B2
(45) Date of Patent: *Apr. 8, 2014

(54) SYNCHRONOUS GLOBAL CONTROLLER FOR ENHANCED PIPELINING

(71) Applicant: Broadcom Corporation, Irvine, CA (US)

(72) Inventors: Ali Anvar, Irvine, CA (US); Gil I. Winograd, Aliso Viejo, CA (US); Esin Terzioglu, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/769,757

(22) Filed: Feb. 18, 2013

(65) Prior Publication Data

US 2013/0194884 A1 Aug. 1, 2013

Related U.S. Application Data

(63) Continuation of application No. 13/435,020, filed on Mar. 30, 2012, now Pat. No. 8,379,478, which is a continuation of application No. 12/750,155, filed on Mar. 30, 2010, now Pat. No. 8,149,645, which is a continuation of application No. 11/766,200, filed on Jun. 21, 2007, now Pat. No. 7,719,920, which is a continuation of application No. 11/191,803, filed on Jul. 28, 2005, now Pat. No. 7,260,020, which is a continuation-in-part of application No. 10/100,758, filed on Mar. 19, 2002, now Pat. No. 6,978,338.

(51) Int. Cl.
*G11C 7/12* (2006.01)

(52) U.S. Cl.
USPC .................. 365/233.1; 365/191; 365/203

(58) Field of Classification Search
None
See application file for complete search history.

(56) References Cited

U.S. PATENT DOCUMENTS

| | | | |
|---|---|---|---|
| 4,802,131 A | 1/1989 | Toyoda | |
| 4,939,691 A | 7/1990 | Mizukami et al. | |
| 5,200,925 A | 4/1993 | Morooka | |
| 5,384,745 A | 1/1995 | Konishi et al. | |
| 5,455,803 A | 10/1995 | Kodama | |
| 5,546,355 A | 8/1996 | Raatz et al. | |
| 5,717,642 A | 2/1998 | Pascucci et al. | |
| 5,742,550 A * | 4/1998 | Yamauchi et al. | 365/203 |
| 5,828,612 A * | 10/1998 | Yu et al. | 365/203 |
| 5,852,586 A | 12/1998 | Fujita | |
| 5,940,606 A | 8/1999 | Ghia et al. | |
| 5,960,213 A | 9/1999 | Wilson | |
| 5,987,590 A | 11/1999 | Wing So | |
| 6,021,077 A | 2/2000 | Nakaoka | |

(Continued)

FOREIGN PATENT DOCUMENTS

| | | |
|---|---|---|
| JP | 11-288400 | 10/1999 |
| WO | WO 98-36417 | 8/1998 |

*Primary Examiner* — Tan T. Nguyen
(74) *Attorney, Agent, or Firm* — Brinks Gilson and Lione

(57) ABSTRACT

A system includes a memory block and a controller. The controller is adapted to skew a pre-charge signal for a bit line of the memory block. The controller can skew the pre-charge signal during a read operation or a write operation. The system can also include a sense amplifier in communication with a bit line of the memory block, and the sense amplifier can automatically shut off after indicating a sensed data state for the bit line. The controller may be a global controller or a local controller.

20 Claims, 34 Drawing Sheets

(56) References Cited

U.S. PATENT DOCUMENTS

| | | | |
|---|---|---|---|
| 6,023,736 A | 2/2000 | Lambeth et al. | |
| 6,034,917 A | 3/2000 | McClure et al. | |
| 6,073,253 A | 6/2000 | Nordstrom et al. | |
| 6,131,149 A | 10/2000 | Lu et al. | |
| 6,170,048 B1 | 1/2001 | Wing So | |
| 6,201,745 B1 * | 3/2001 | Ryu et al. | 365/200 |
| 6,246,614 B1 | 6/2001 | Ooishi | |
| 6,307,806 B1 | 10/2001 | Tomita et al. | |
| 6,385,125 B1 | 5/2002 | Ooishi et al. | |
| 6,574,163 B2 | 6/2003 | Maeda | |
| 6,675,251 B1 | 1/2004 | Streitenberger et al. | |
| 6,735,139 B2 | 5/2004 | Tang | |
| 6,754,126 B2 | 6/2004 | Yamaguchi et al. | |
| 6,809,984 B2 | 10/2004 | Nagano | |
| 6,928,026 B2 * | 8/2005 | Anvar et al. | 365/233.16 |
| 6,967,894 B2 | 11/2005 | Kondo | |
| 7,260,020 B2 * | 8/2007 | Anvar et al. | 365/189.16 |
| 7,719,920 B2 | 5/2010 | Anvar et al. | |
| 8,149,645 B2 * | 4/2012 | Anvar et al. | 365/233.1 |
| 2002/0048198 A1 | 4/2002 | Terzioglu et al. | |

\* cited by examiner

300A

SYNCHRONOUS GLOBAL CONTROLLER FOR ENHANCED PIPELINING

CROSS REFERENCE TO RELATED APPLICATIONS

This application is a continuation of and claims the benefit of priority from U.S. application Ser. No. 13/435,020, filed Mar. 30, 2012, titled "Synchronous Global Controller for Enhanced Pipelining", which is a continuation of U.S. application Ser. No. 12/750,155, filed Mar. 30, 2010, titled "Synchronous Global Controller for Enhanced Pipelining" and issued as U.S. Pat. No. 8,149,645, which is a continuation of U.S. application Ser. No. 11/766,200, filed Jun. 21, 2007, titled "Synchronous Global Controller for Enhanced Pipelining" and issued as U.S. Pat. No. 7,719,920, which is a continuation of U.S. application Ser. No. 11/181,803, filed Jul. 28, 2005, titled "Synchronous Global Controller for Enhanced Pipelining" and issued as U.S. Pat. No. 7,260,020, which is a continuation-in-part of, and claims benefit of and priority from, U.S. application Ser. No. 10/100,757, filed Mar. 19, 2002, titled "Synchronous Controlled, Self-Timed Local SRAM Block" and issued as U.S. Pat. No. 6,646,954. The complete subject matter of each of the previously referenced documents are incorporated herein by reference in their entirety.

BACKGROUND OF THE INVENTION

One embodiment of the present invention relates to memory devices. In particular, one embodiment of the present invention relates to a synchronously controlled global controller for memory devices.

Memory structures or devices have become integral parts of modern VLSI systems, including digital line processing systems. Although typically it is desirable to incorporate as many memory cells as possible into a given area of a memory structure, memory cell density is usually constrained by other design factors such as layout efficiency, performance, power requirements, and noise sensitivity.

In view of the trends toward compact, high-performance, high-bandwidth integrated computer networks, portable computing, and mobile communications, the aforementioned constraints may impose severe limitations upon memory structure designs, which traditional memory structures and subcomponent implementations may fail to obviate.

A certain amount of time is needed to complete a read or write operation in such memory structures. After the read or write operation is complete, additional time is needed to recharge the signals. The minimum cycle time is achieved if pre-charging starts right after completion of the read or write operation. However, there is no signal indicating the completion of the read or write operation. As a result, pre-chargers are generally fired at the falling edge of a clock pulse, so that the write or read operations must be completed in the first half of the cycle when the clock pulse is high. In other words the clock pulse must remain high long enough for the read and write operations to finish. In the second half of the cycle, when clock is low, the pre-chargers precharge

DETAILED DESCRIPTION OF THE INVENTION

As will be understood by one skilled in the art, most VLSI systems, including communications systems and DSP devices, contain VLSI memory subsystems. Modern applications of VLSI memory subsystems almost invariably demand high efficiency, high performance implementations that magnify the design tradeoffs between layout efficiency, speed, power consumption, scalability, design tolerances, and the like. The present invention ameliorates these tradeoffs using a novel synchronous, self-timed hierarchical architecture. The memory module of the present invention also may employ one or more novel components, which further add to the memory module's efficiency and robustness.

It should be appreciated that it is useful to describe the various aspects and embodiments of the invention herein in the context of an SRAM memory structure, using CMOS SRAM memory cells. However, it should be further appreciated by those skilled in the art the present invention is not limited to CMOS-based processes and that these aspects and embodiments may be used in memory products other than a SRAM memory structure, including without limitation, DRAM, ROM, PLA, and the like, whether embedded within a VLSI system, or stand alone memory devices.

Exemplary SRAM Module

Figure 1:
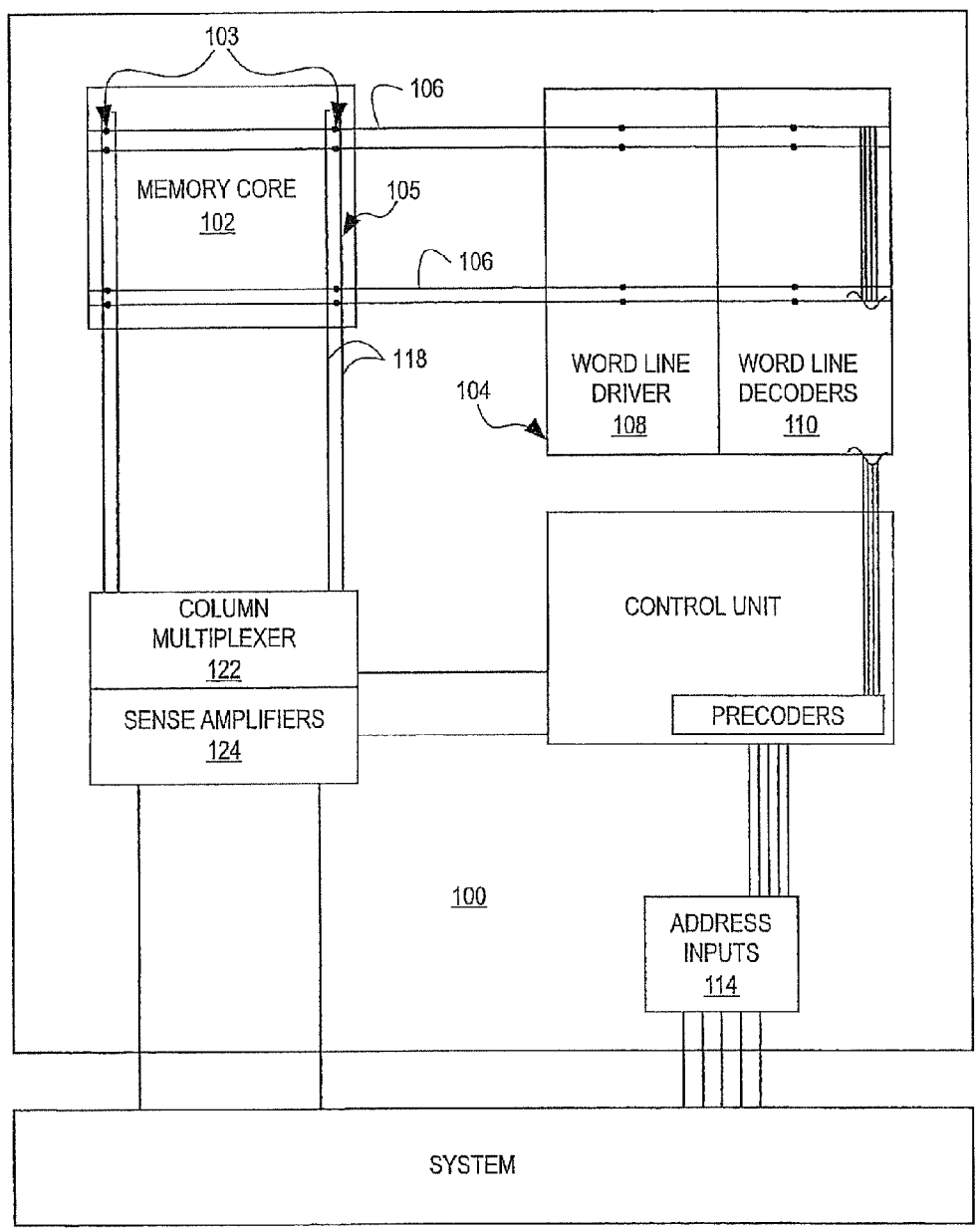
FIG. 1 illustrates a block diagram of an exemplary SRAM module.

FIG. 1 illustrates a functional block diagram of one example of a SRAM memory structure 100 providing the basic features of SRAM subsystems. Module 100 includes memory core 102, word line controller 104, and memory address inputs 114. In this exemplary embodiment, memory core 102 is composed of a two-dimensional array of K-bits of memory cells 103, arranged to have C columns and R rows of bit storage locations, where K=[C×R]. The most common configuration of memory core 102 uses single word lines 106 to connect cells 103 onto paired differential bitlines 118. In general, core 102 is arranged as an array of $2^P$ entries based on a set of P memory address in. Thus, the p-bit address is decoded by row address decoder 110 and column address decoder 122. Access to a given memory cell 103 within such a single-core memory 102 is accomplished by activating the column 105 by selecting bitline in the column corresponding to cell 103.

The particular row to be accessed is chosen by selective activation of row address or wordline decoder 110, which usually corresponds uniquely with a given row, or word line, spanning all cells 103 in that particular row. Also, word line driver 108 can drive a selected word line 106 such that selected memory cell 103 can be written into or read out on a particular pair of bitlines 118, according to the bit address supplied to memory address inputs 114.

Bitline controller 116 may include precharge cells (not shown), column multiplexers or decoders 122, sense amplifiers 124, and input/output buffers (not shown). Because different READ/WRITE schemes are typically used for memory cells, it is desirable that bitlines be placed in a well-defined state before being accessed. Precharge cells may be used to set up the state of bitlines 118, through a PRECHARGE cycle according to a predefined precharging scheme. In a static precharging scheme, precharge cells may be left continuously on except when accessing a particular block.

In addition to establishing a defined state on bitlines 118, precharging cells can also be used to effect equalization of differential voltages on bitlines 118 prior to a READ operation. Sense amplifiers 124 enable the size of memory cell 103 to be reduced by sensing the differential voltage on bitlines 118, which is indicative of its state, translating that differential voltage into a logic-lever signal.

In the exemplary embodiment, a READ operation is performed by enabling row decoder 110, which selects a particular row. The charge on one of the bitlines 118 from each pair of bitlines on each column will discharge through the enabled memory cell 103, representing the state of the active cells 103 on that column 105. Column decoder 122 enables only one of the columns, connecting bitlines 118 to an output. Sense amplifiers 124 provide the driving capability to source current to the output including input/output buffers. When sense amplifier 124 is enabled, the unbalanced bitlines 118 will cause the balanced sense amplifier to trip toward the state of the bitlines, and data will be output.

In general, a WRITE operation is performed by applying data to an input including I/O buffers (not shown). Prior to the WRITE operation, bitlines 118 may be precharged to a predetermined value by precharge cells. The application of input data to the inputs tend to discharge the precharge voltage on one of the bitlines 118, leaving one bitline logic HIGH and one bitline logic LOW. Column decoder 122 selects a particular column 105, connecting bitlines 118 to the input, thereby discharging one of the bitlines 118. The row decoder 110 selects a particular row, and the information on bitlines 118 will be written into cell 103 at the intersection of column 105 and row 106.

At the beginning of a typical internal timing cycle, precharging is disabled. The precharging is not enabled again until the entire operation is completed. Column decoder 122 and row decoder 110 are then activated, followed by the activation of sense amplifier 124. At the conclusion of a READ or a WRITE operation, sense amplifier 124 is deactivated. This is followed by disabling decoders 110, 122, at which time precharge cells 120 become active again during a subsequent PRECHARGE cycle.

Power Reduction and Speed Improvement

In reference to FIG. 1, the content of memory cell 103 of memory block 100 is detected in sense amplifier 124, using a differential line between the paired bitlines 118. It should be appreciated that this architecture is not scalable. Also, increasing the memory block 100 may exceed the practical limitations of the sense amplifiers 124 to receive an adequate signal in a timely fashion at the bitlines 118. Increasing the length of bitlines 118 increases the associated bitline capacitance and, thus, increases the time needed for a voltage to develop thereon. More power must be supplied to lines 104, 106 to overcome the additional capacitance.

In addition, it takes longer to precharge long bitlines under the architectures of the existing art, thereby reducing the effective device speed. Similarly, writing to longer bitlines 118, as found in the existing art, requires more extensive current. This increases the power demands of the circuit, as well as reducing the effective device speed.

In general, reduced power consumption in memory devices such as structure 100 in FIG. 1 can be accomplished by, for example, reducing total switched capacitance, and minimizing voltage swings. The advantages of the power reduction aspects of certain embodiments of the present invention can further be appreciated with the context of switched capacitance reduction and voltage swing limitation.

Switched Capacitance Reduction

As the bit density of memory structures increases, it has been observed that single-core memory structures may have unacceptably large switching capacitances associated with each memory access. Access to any bit location within such a single-core memory necessitates enabling the entire row, or word line 106, in which the datum is stored, and switching all bitlines 118 in the structure. Therefore, it is desirable to design high-performance memory structures to reduce the total switched capacitance during any given access.

Two well-known approaches for reducing total switched capacitance during a memory structure access include dividing a single-core memory structure into a banked memory structure, and employing divided word line structures. In the former approach, it is necessary to activate only the particular memory bank associated with the memory cell of interest. In the latter approach, localizing word line activation to the greatest practicable extent reduces total switched capacitance.

Divided or Banked Memory Core

Figure 2:
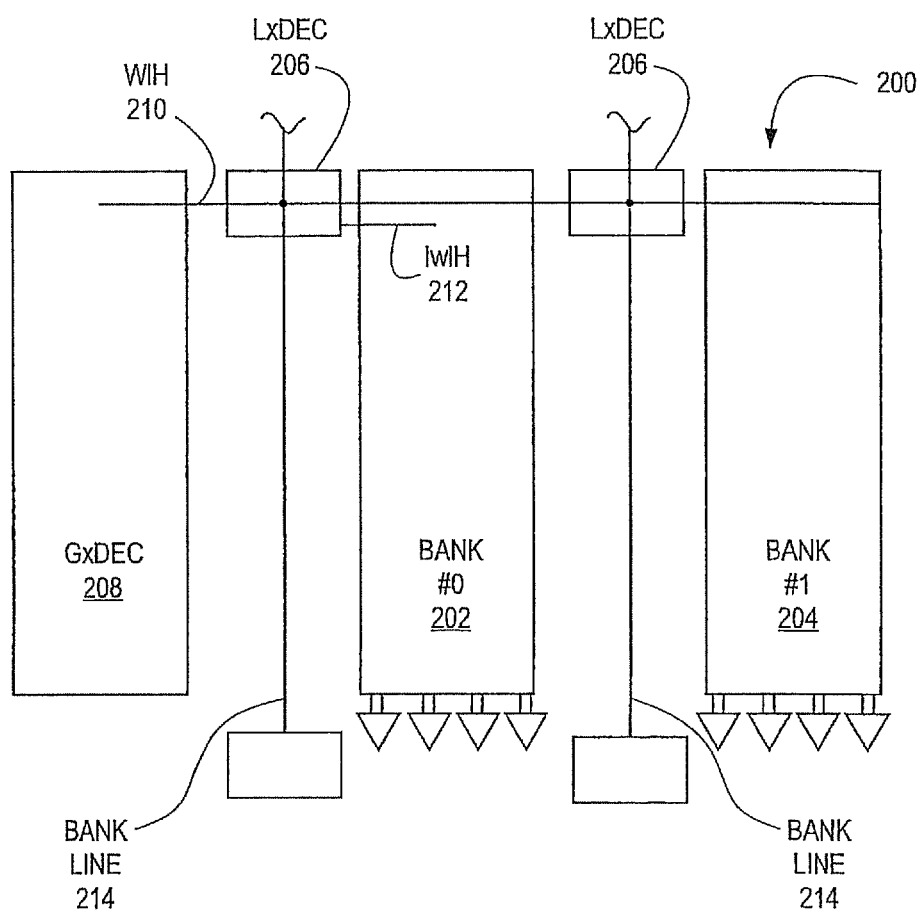
FIG. 2 illustrates a block diagram of a SRAM memory core divided into banks.

One approach to reducing switching capacitances is to divide the memory core into separately switchable banks of memory cells. One example of a memory core 200 divided into banks is illustrated in FIG. 2. In the illustrated embodiment, the memory core includes two banks of memory cells, bank #0 and bank #1, generally designated 202 and 204 respectively. The memory core 200 includes two local decoders 206 that are communicatively coupled to each other and a global decoder 208 via world line High 210. Each local decoder 206 includes a local word line High 210 that communicatively couples the decoder 206 to its associated bank. Additionally, two bank lines 214 are shown communicatively coupled or interfaced to the local decoders 206. It should be appreciated that, in one embodiment, one bank line 214 is associated with each bank.

Typically, the total switched capacitance during a given memory access for banked memory cores is inversely proportional to the number of banks employed. By judiciously selecting the number and placement of the bank units within a given memory core design, as well as the type of decoding used, the total switching capacitance, and thus the overall power consumed by the memory core, can be greatly reduced. Banked design may also realize a higher product yield. The memory banks can be arranged such that a defective bank is rendered inoperable and inaccessible, while the remaining operational banks of the memory core 200 can be packed into a lower-capacity product.

However, banked designs may not be appropriate for certain applications. Divided memory cores demand additional decoding circuitry to permit selective access to individual banks. In other words, such divided memory cores may demand an additional local decoder 206, local bank line 214 and local word line High 210 for example. Delay may occur as a result. Also, many banked designs employ memory segments that are merely scaled-down versions of traditional monolithic core memory designs, with each segment having dedicated control, precharging, decoding, sensing, and driving circuitry. These circuits tend to consume much more power in both standby and operational modes than their associated memory cells. Such banked structures may be simple to design, but the additional complexity and power consumption can reduce overall memory component performance.

By their very nature, banked designs are not suitable for scaling-up to accommodate large design requirements. Also, traditional banked designs may not be readily adaptable to applications requiring a memory core configuration that is substantially different from the underlying bank architecture (e.g., a memory structure needing relatively few rows of long word lengths). Traditional bank designs are generally not readily adaptable to a memory structure needing relatively few rows of very long word lengths.

Rather than resort to a top-down division of the basic memory structure using banked memory designs, one or more embodiments of the present invention provide a hierarchical memory structure that is synthesized using a bottom-up approach. Hierarchically coupling basic memory modules with localized decision-making features that synergistically cooperate to dramatically reduce the overall power needs, and improve the operating speed, of the structure. At a minimum, such a basic hierarchical module can include localized bitline sensing.

Divided Word Line

Often, the bit-width of a memory component is sized to accommodate a particular word length. As the word length for a particular design increases, so do the associated word line delays, switched capacitance, power consumption, and the like. To accommodate very long word lines, it may be desirable to divide core-spanning global word lines into local word lines, each consisting of smaller groups of adjacent, word-oriented memory cells. Each local group employs local decoding and driving components to produce the local word lines when the global word line, to which it is coupled, is activated. In long word length applications, the additional overhead incurred by divided word lines can be offset by reduced word line delays.

Rather than resorting to the traditional top-down division of word lines, certain embodiments of the invention herein include providing a local word line to the aforementioned basic memory module, which further enhances the local decision making features of the module. As before, by using a bottom-up approach to hierarchically couple basic memory modules as previously described with the added localized decision-making features of local word lines according to the present invention, additional synergies maybe realized, which further reduce overall power consumption and signal propagation times.

Multiplexing

One alternative to a banked memory core design is to multiplex or mux the memory cells. In other words, bits from different words are not stored sequentially. For example, in 2:1 muxing, bits from two words are stored in an alternating pattern. For example, if the number 1 represents bits from a first word, while the number 2 represent bits from a second word. During a READ or WRITE operation the mux selects which column it is looking at (i.e., the left or right bit). It should be appreciated that muxing may save space. Banked designs without muxing require one sense amplifier for every two lines. In 2:1 muxing for example, one sense amplifier is used for every four lines (i.e., one sense amplifier ties two sets of bitlines together). Muxing enables sense amps to be shared between muxed cells, which may increase the layout pitch and area efficiency.

In general, muxing consumes more power than the banked memory core design. For example, to read a stored word, the mux accesses or enables an entire row in the cell array, reading all the data stored therein, only sensing the data needed and disregarding the remainder.

Using a bottom-up approach to hierarchically couple basic memory modules with muxing according to an embodiment of the present invention, additional synergies are realized, reducing power consumption and signal propagation times.

Voltage-Swing Reduction Techniques

Power reduction may also be achieved by reducing the voltage swings experienced throughout the structure. By limiting voltage swings, it is possible to reduce the amount of power dissipated as the voltage at a node or on a line decays during a particular event or operation, as well as to reduce the amount of power required to return the various decayed voltages to the desired state after the particular event or operation, or prior to the next access. Two techniques to this end include using pulsed word lines and sense amplifier voltage swing reduction.

Pulsed Word Lines

By providing a word line just long enough to correctly detect the differential voltage across a selected memory cell, it is possible to reduce the bitline voltage discharge corresponding to a READ operation of the selected cell. In some designs, by applying a pulsed signal to the associated word line over a chosen interval, a sense amplifier is activated only during that interval, thereby reducing the duration of the bitline voltage decay. These designs typically use some from of pulse generator that produces a fixed-duration pulse. If the duration of the pulse is targeted to satisfy worst-case timing scenarios, the additional margin will result in unnecessary bitline current draw during nominal operations.

Therefore, it may be desirable to employ a self-timed, self-limiting word line device that is responsive to the actual duration of a given READ operation on a selected cell, and that substantially limits word line activation during that duration. Furthermore, where a sense amplifier successfully completes a READ operation in less than a memory system clock cycle, it may also be desirable to have asynchronous pulse width activation, relative to the memory system clock. Certain aspects of the present invention may provide a pulsed word line signal, for example, using a cooperative interaction between local decoder and local controller.

Sense Amplifier Voltage Swing Reduction

In order to make large memory arrays, it is most desirable to keep the size of an individual memory cell to a minimum. As a result, individual memory cells generally are incapable of supplying a driving current to associated input/output bitlines. Sense amplifiers typically are used to detect the value of the data stored in a particular memory cell and to provide the current needed to drive the I/O lines.

In a sense amplifier design, there typically is a trade-off between power and speed, with faster response times usually dictating greater power requirements. Faster sense amplifiers can also tend to be physically larger, relative to low speed, low power devices. Furthermore, the analog nature of sense amplifiers can result in their consuming an appreciable fraction of the total power. Although one way to improve the responsiveness of a sense amplifier is to use a more sensitive sense amplifier, any gained benefits are offset by the concomitant circuit complexity which nevertheless suffers from increased noise sensitivity. It is desirable, then, to limit bitline voltage swings and to reduce the power consumed by the sense amplifier.

In one typical design, the sense amplifier detects the small differential signals across a memory cell, which is in an unbalanced state representative of data value stored in the cell, and amplifies the resulting signal to logic level. Prior to a READ operation, the bitlines associated with a particular memory column are precharged to a chosen value. When a specific memory cell is enabled, a particular row in which the memory cell is located and a sense amplifier associated with the particular column are selected. The charge on one of those bitlines associated with the memory cell is discharged through the enabled memory cell, in a manner corresponding to the value of the data stored in the memory cell. This produces an imbalance between the signals on the paired bitlines, causing a bitline voltage swing.

When enabled, the sense amplifier detects the unbalanced signal and, in response, the usually balanced sense amplifier state changes to a state representative of the value of the data. This state detection and response occurs within a finite period, during which a specific amount of power is dissipated. In one embodiment, latch-type sense amps only dissipate power during activation, until the sense amp resolves the data. Power is dissipated as voltage develops on the bitlines. The greater the voltage decay on the precharged bitlines, the more power dissipated during the READ operation.

It is contemplated that using sense amplifiers that automatically shut off once a sense operation is completed may reduce power. A self-latching sense amplifier for example turns off as soon as the sense amplifier indicates the sensed data state. Latch type sense amps require an activation signal which, in one embodiment is generated by a dummy column timing circuit. The sense amp drives a limited swing signal out of the global bitlines to save power.

Redundancy

Memory designers typically balance power and device area concerns against speed. High-performance memory components place a severe strain on the power and area budgets of associated systems, particularly where such components are embedded within a VLSI system such as a digital signal processing system. Therefore, it is highly desirable to provide memory subsystems that are fast, yet power- and area-efficient.

Highly integrated, high performance components require complex fabrication and manufacturing processes. These processes may experience unavoidable parameter variations which can impose unwanted physical defects upon the units being produced, or can exploit design vulnerabilities to the extent of rendering the affected units unusable or substandard.

In a memory structure, redundancy can be important, because a fabrication flaw, or operational failure, of even a single bit cell, for example, may result in the failure of the system relying upon that memory. Likewise, process invariant features may be needed to insure that the internal operations of the structure conform to precise timing and parametric specifications. Lacking redundancy and process invariant features, the actual manufacturing yield for a particular memory are particularly unacceptable when embedded within more complex systems, which inherently have more fabrication and manufacturing vulnerabilities. A higher manufacturing yield translates into lower per-unit costs, while a robust design translates into reliable products having lower operational costs. Thus, it is highly desirable to design components having redundancy and process invariant features wherever possible.

Redundancy devices and techniques constitute other certain preferred aspects of the invention herein that, alone or together, enhance the functionality of the hierarchical memory structure. The previously discussed redundancy aspects of the present invention can render the hierarchical memory structure less susceptible to incapacitation by defects during fabrication or operation, advantageously providing a memory product that is at once more manufacturable and cost-efficient, and operationally more robust.

Redundancy within a hierarchical memory module can be realized by adding one or more redundant rows, columns, or both, to the basic module structure. Moreover, a memory structure composed of hierarchical memory modules can employ one or more redundant modules for mapping to failed memory circuits. A redundant module may provide a one-for-one replacement of a failed module, or it can provide one or more memory cell circuits to one or more primary memory modules.

Memory Module with Hierarchical Functionality

The modular, hierarchical memory architecture according to one embodiment of the present invention provides a compact, robust, power-efficient, high-performance memory system having, advantageously, a flexible and extensively scalable architecture. The hierarchical memory structure is composed of fundamental memory modules or blocks which can be cooperatively coupled, and arranged in multiple hierarchical tiers, to devise a composite memory product having arbitrary column depth or row length. This bottom-up modular approach localizes timing considerations, decision-making, and power consumption to the particular unit(s) in which the desired data is stored.

Within a defined design hierarchy, the fundamental memory subsystems or blocks may be grouped to form a larger memory structure, that itself can be coupled with similar memory structures to form still larger memory structures. In turn, these larger structures can be arranged to create a complex structure, including a SRAM module, at the highest tier of the hierarchy. In hierarchical sensing, it is desired to provide two or more tiers of bit sensing, thereby decreasing the READ and WRITE time of the device, i.e., increasing effective device speed, while reducing overall device power requirements. In a hierarchical design, switching and memory cell power consumption during a READ/WRITE operation are localized to the immediate vicinity of the memory cells being evaluated or written, i.e., those memory cells in selected memory subsystems or blocks, with the exception of a limited number of global word line selectors, sense amplifiers, and support circuitry. The majority of subsystems or blocks that do not contain the memory cells being evaluated or written generally remain inactive.

Alternate embodiments of the present invention provide a hierarchical memory module using local bitline sensing, local word line decoding, or both, which intrinsically reduces overall power consumption and signal propagation, and increases overall speed, as well as increasing design flexibility and scalability. Aspects of the present invention contemplate apparatus and methods which further limit the overall power dissipation of the hierarchical memory structure, while minimizing the impact of a multi-tier hierarchy. Certain aspects of the present invention are directed to mitigate functional vulnerabilities that may develop from variations in operational parameters, or that related to the fabrication process.

Hierarchical Memory Modules

In prior art memory designs, such as the aforementioned banked designs, large logical memory blocks are divided into smaller, physical modules, each having the attendant overhead of an entire block of memory including predecoders, sense amplifiers, multiplexers, and the like. In the aggregate, such memory blocks would behave as an individual memory block. However, using the present invention, SRAM memory modules of comparable, or much larger, size can be provided by coupling hierarchical functional subsystems or blocks into larger physical memory modules of arbitrary number of words and word length. For example, existing designs that aggregate smaller memory modules into a single logical modules usually require the replication of the predecoders, sense amplifiers, and other overhead circuitry that would be associated with a single memory module.

According to the present invention, this replication is unnecessary, and undesirable. One embodiment of the present invention comprehends local bitline sensing, in which a limited number of memory cells are coupled with a single local sense amplifier, thereby forming a basic memory module. Similar memory modules are grouped and arranged to form blocks that, along with the appropriate circuitry, output the local sense amplifier signal to the global sense amplifier. Thus, the bitlines associated with the memory cells in the block are not directly coupled with a global sense amplifier, mitigating the signal propagation delay and power consumption typically associated with global bitline sensing. In this approach, the local bitline sense amplifier quickly and economically sense the state of a selected memory cell in a block and reports the state to the global sense amplifier.

In another embodiment of the invention herein, providing a memory block, a limited number of memory cells, among other units. Using local word line decoding mitigates the delays and power consumption of global word line decoding. Similar to the local bitline sensing approach, a single global word line decoder can be coupled with the respective local word line decoders of multiple blocks. When the global decoder is activated with an address, only the local word line decoder associated with the desired memory cell of a desired block responds, activating the memory cell. This aspect, too, is particularly power-conservative and fast, because the loading on the global line is limited to the associated local word line decoders, and the global word line signal need be present only as long as required to trigger the relevant local word line. In yet another embodiment of the present invention, a hierarchical memory block employing both local bitline sensing and local word line decoding is provided, which realizes the advantages of both approaches. Each of the above embodiments among others, is discussed below.

Synchronous Controlled Self-Timed SRAM

Figure 3A:
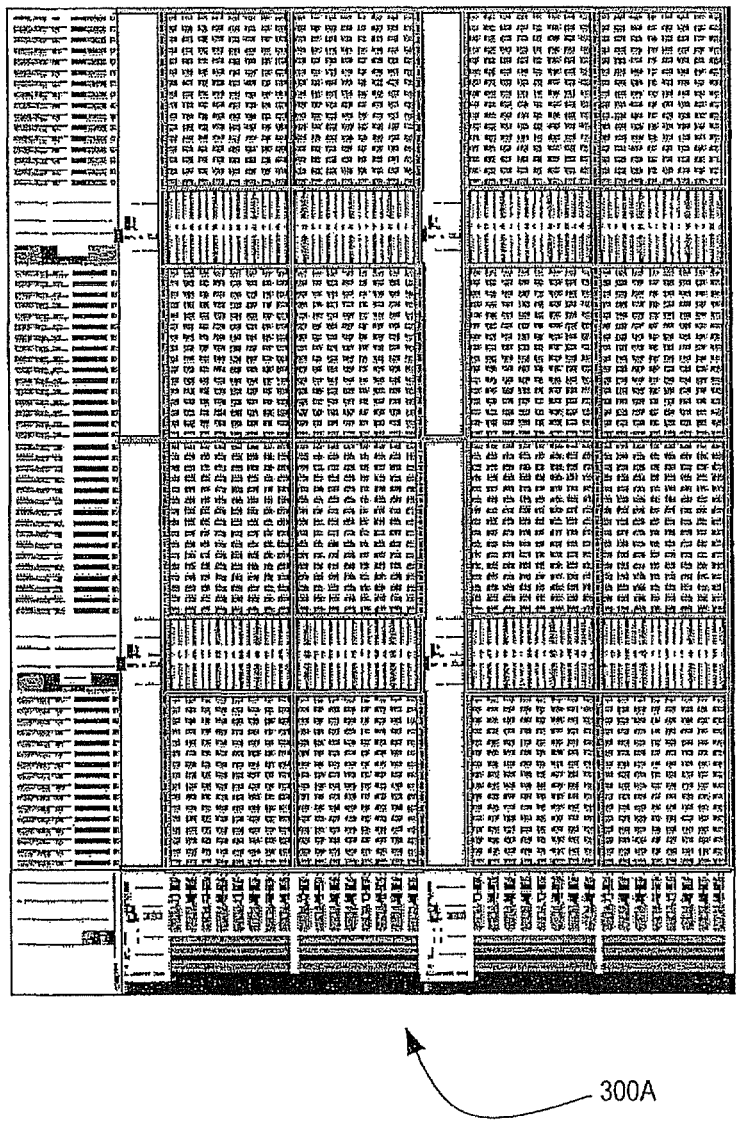
FIGS. 3A and 3B illustrate SRAM modules including a block structure or subsystem in accordance with one embodiment of the present invention.
Figure 3B:
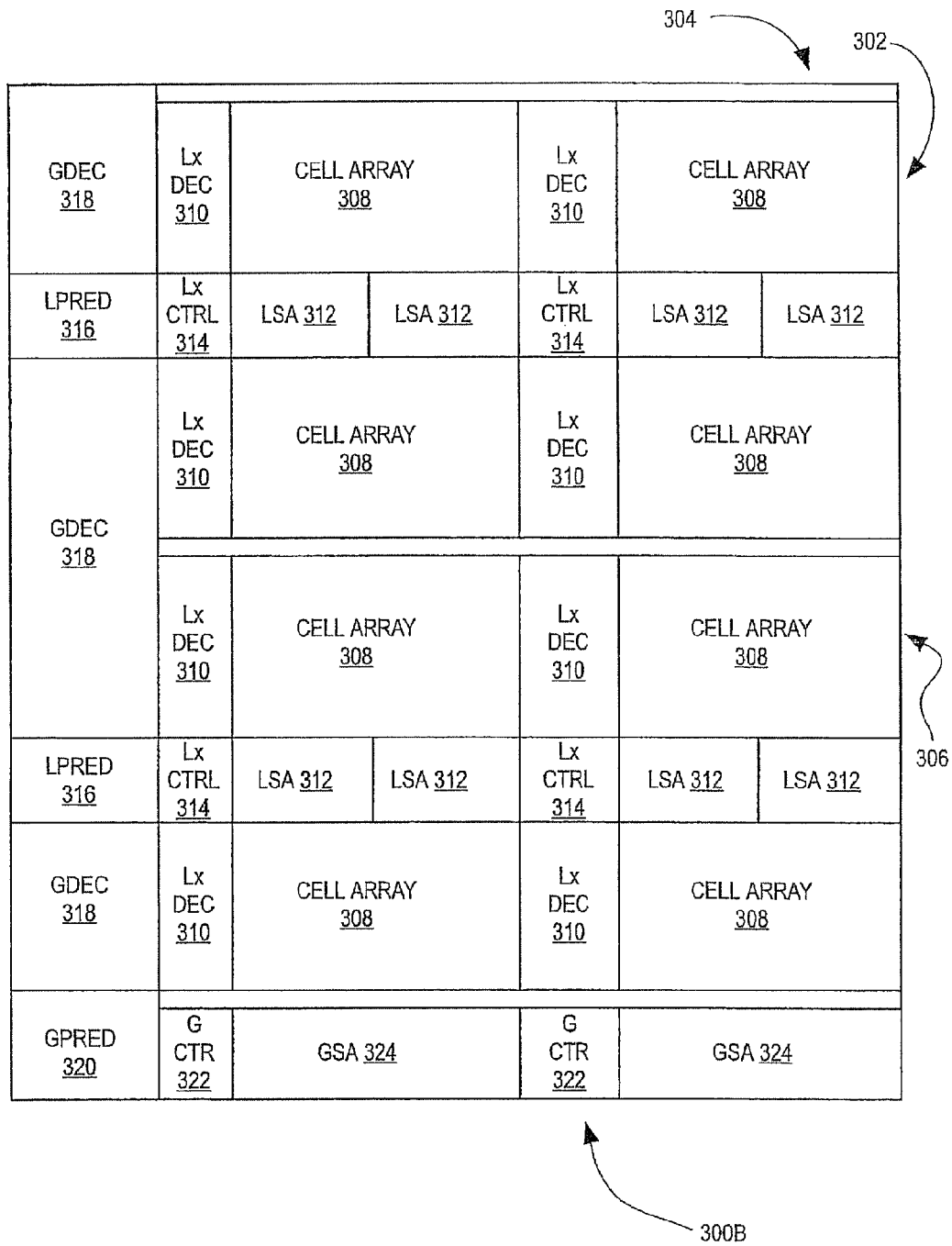

One embodiment of a 0.13 µm SRAM module, generally designated 300, is illustrated in FIGS. 3A and 3B. It should be appreciated that, while a 0.13 µm SRAM module is illustrated, other sized SRAM modules are contemplated. The illustrated SRAM embodiment comprises a hierarchical memory that breaks up a large memory into a two-dimensional array of blocks. In this embodiment, a row of blocks is designated a row block while a column of blocks is designated a column block. A pair of adjacent row blocks 302 and column blocks 304 is illustrated.

It should be appreciated that the terms row blocks and block columns are arbitrary designations that are assigned to distinguish the blocks extending in one direction from the blocks extending perpendicular thereto, and that these terms are independent of the orientation of the SRAM 300. It should also be appreciated that, while four blocks are depicted, any number of column and row blocks are contemplated. The number of blocks in a row block may generally range anywhere from 1 to 16, while the number of blocks in a column block may generally range anywhere from 1 to 16, although larger row and column blocks are contemplated.

In one embodiment, a block 306 comprises at least four entities: (1) one or more cell arrays 308; (2) one or more local decoders 310 (alternatively referred to as "LxDEC 710"); (3) one or more local sense amps 312 (alternatively referred to as "LSA 712"); and (4) one or more local controllers 314 (alternatively referred to as "LxCTRL 714"). In an alternative embodiment, the block 306 may include clusters as described below.

SRAM 300 illustrated in FIGS. 3A and 3B includes two local predecoders 316 (alternatively referred to as "LxPRED"), three global decoders 318 (alternatively referred to as "GxDEC"), a global predecoder 320 (alternatively referred to as "GxPRED"), two global controllers 322 (alternatively referred to as "GxCTR"), and two global sense amps 324 (alternatively referred to as "GSA 724") in addition to the illustrated block 306 comprising eight cell arrays 308, six local decoders 310, eight local sense amps 312, and two local controllers 314. It should be appreciated that one embodiment comprise one local sense amp (and in one embodiment one 4:1 mux) for every four columns of memory cell, each illustrated global controller comprises a plurality of global controllers, one global controller for each local controller, and each illustrated local controller comprises a plurality of local controllers, one for each row of memory cells.

Figure 4:
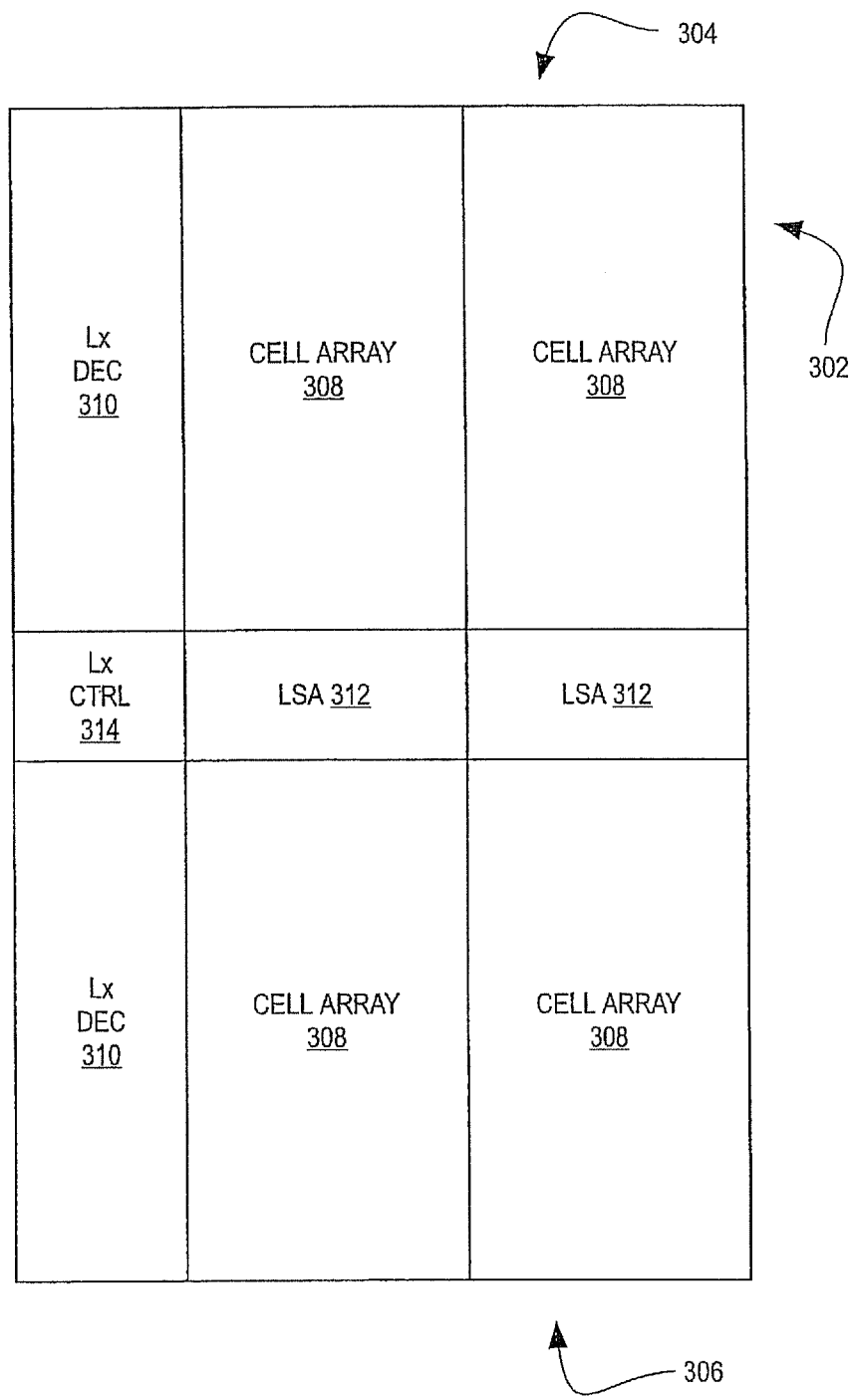
FIG. 4 illustrates a dimensional block array or subsystem used in a SRAM module in accordance with one embodiment of the present invention.

An alternative embodiment of block 306 comprising only four cell arrays 308, two local decoders 310, two local sense amps 312, and one local controller 314 is illustrated in FIG. 4. Typically, the blocks range in size from about 2 Kbits to about 150 Kbits.

In one embodiment, the blocks 306 may be broken down further into smaller entities. One embodiment includes an array of sense amps arranged in the middle of the cell arrays 308, dividing the cell arrays into top and bottom sub-blocks as discussed below.

Figure 5:
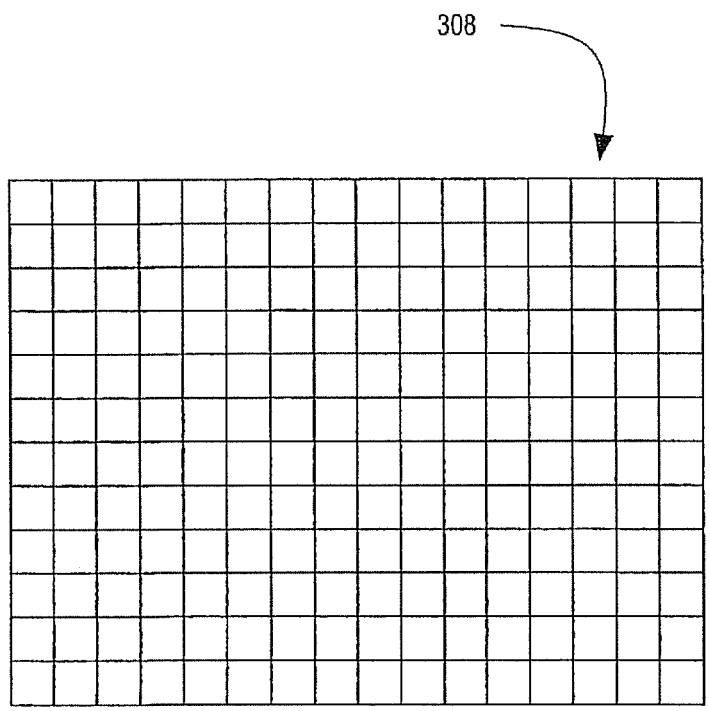
FIG. 5 illustrates a cell array comprising a plurality of memory cells in accordance with one embodiment of the present invention.
Figure 6A:
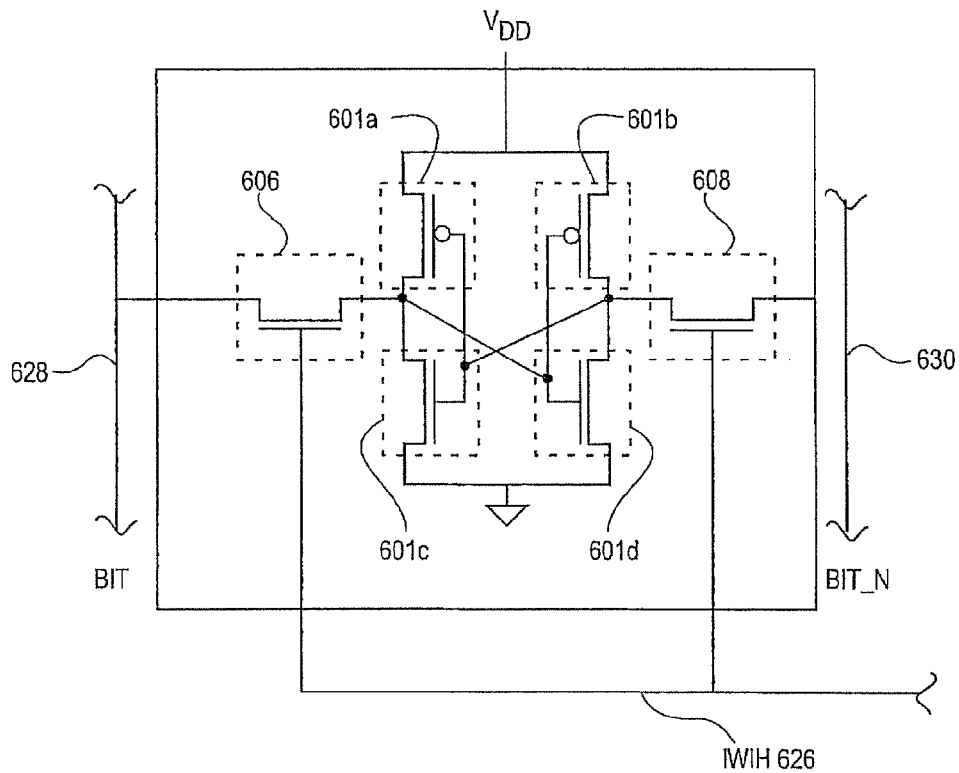
FIG. 6A illustrates a memory cell used in accordance with one embodiment of the present invention.

It is contemplated that, in one embodiment, the external signals that control each block 300 are all synchronous. That is, the pulse duration of the control signals are equal to the clock high period of the SRAM module. Further, the internal timing of each block 300 is self-timed. In other words the pulse duration of the signals are dependent on a bit-line decay time and are independent of the clock period. This scheme is globally robust to RC effects, locally fast and power-efficient as provided below Memory Cell In one embodiment the cell arrays 308 of the SRAM 300 comprises a plurality of memory cells as illustrated in FIG. 5, where the size of the array (measured in cell units) is determined by rows×cols. For example, a megabit memory cell array comprises a 1024×1024 memory cells. One embodiment of a memory cell used in the SRAM cell array comprises a six-transistor CMOS cell 600A (alternatively referred to as "6T cell") is illustrated in FIG. 6A. In the illustrated embodiment, 6T cell 600 includes transistors 601a, 601b, 601c and 601d.

Each 6T cell 600 interfaces to a local wordline 626 (alternatively referred to as lwIH), shared with all other 6T cells in the same row in a cell array. A pair of local bitlines, designated bit and bit_n and numbered 628 and 630 respectively, are shared with all other 6T cells 600 in the same column in the cell array. In one embodiment, the local wordline signal enters each 6T cell 600 directly on a poly line that forms the gate of cell access transistors 632 and 634 as illustrated. A jumper metal line also carries the same local wordline signal. The jumper metal line is shorted to the poly in strap cells that are inserted periodically between every 16 or 32 columns of 6T cells 600. The poly in the strap cells is highly resistive and, in one embodiment of the present invention, is shunted by a metal jumper to reduce resistance.

In general, the 6T cell 600 exists in one of three possible states: (1) the STABLE state in which the 6T cell 600 holds a signal value corresponding to a logic "1" or logic "0"; (2) a READ operation state; or (3) a WRITE operation state. In the STABLE state, 6T cell 600 is effectively disconnected from the memory core (e.g., core 102 in FIG. 1). In one example, the bit lines, i.e., bit and bit_n lines 628, 630 respectively, are precharged HIGH (logic "1") before any READ or WRITE operation takes place. Row select transistors 632, 634 are turned off during precharge. Local sense amplifier block (not shown but similar to LSA 712) is interfaced to bit line 628 and bit_n line 630, similar to LSA 712 in FIGS. 3A, 3B and 4, supply precharge power.

A READ operation is initiated by performing a PRECHARGE cycle, precharging bit line 628 and bit_n line 630 to logic HIGH, and activating LwLH 626 using row select transistors 632, 634. One of the bitlines discharges through 6T cell 600, and a differential voltage is setup between bit line 628 and bit_n line 630. This voltage is sensed and amplified to logic levels.

A WRITE operation to 6T cell 600 is carried out after another PRECHARGE cycle, by driving bitlines 628, 630 to the required state, corresponding to write data and activating lwIH 626. CMOS is a desirable technology because the supply current drawn by such an SRAM cell typically is limited to the leakage current of transistors 601a-d while in the STABLE state.

Figure 6B:
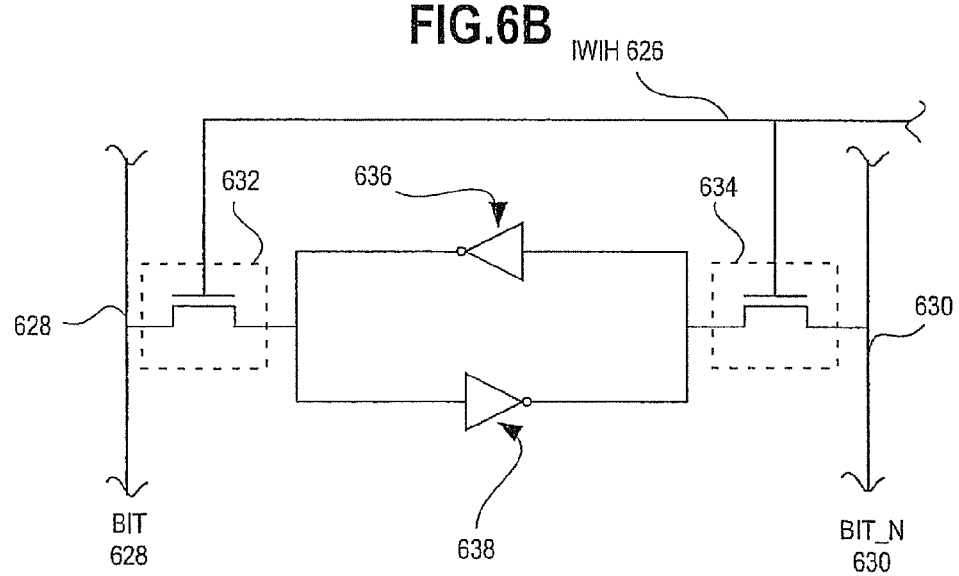
FIG. 6B illustrates back-to-back inventors representing the memory cell of FIG. 6A in accordance with one embodiment of the present invention.

FIG. 6B illustrates an alternative representation of the 6T cell illustrated in FIG. 6A. In this embodiment, transistors 601a, 601b, 601c and 601d are represented as back-to-back inventors 636 and 638 respectively as illustrated.

Local Decoder

Figure 7:
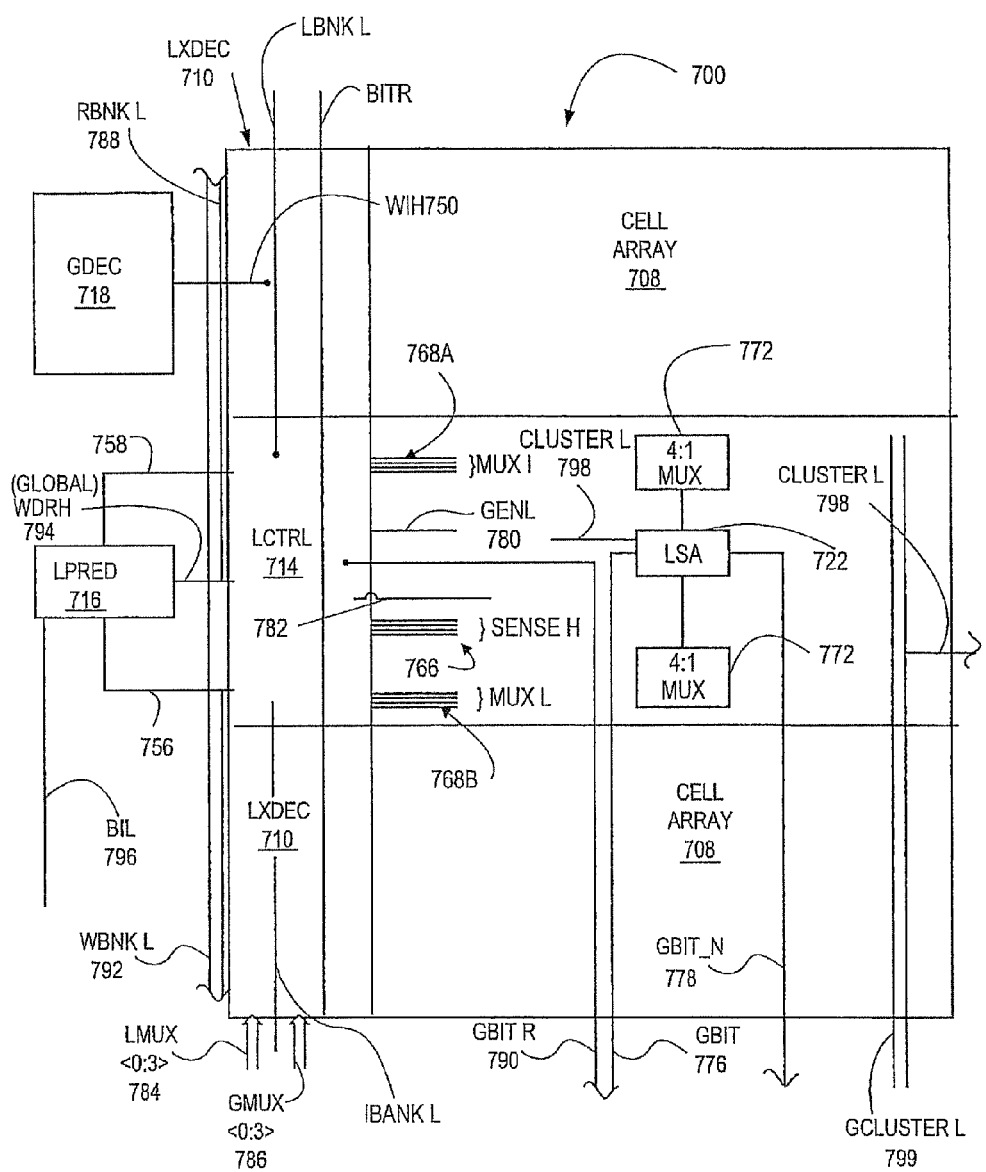
FIG. 7 illustrates a SRAM module similar to that illustrated FIGS. 3A and 3B in accordance with one embodiment of the present invention.

A block diagram of one embodiment of a SRAM module 700, similar to the SRAM module 300 of FIGS. 3A, 3B and 4, is illustrated in FIG. 7. This embodiment includes a one-dimensional array of local x-decoders or LxDEC 710 similar to the LxDEC 310. The LxDEC 710 array is physically arranged as a vertical array of local x-decoders located proximate the cell array 708. The LxDEC 710 interfaces with or is communicatively coupled to a global decoder or GxDEC 718.

In one embodiment, the LxDEC 710 is located to the left of the cell array 708. It should be appreciated that the terms "left," or "right," "up," or "down," "above," or "below" are arbitrary designations that are assigned to distinguish the units extending in one direction from the units extending in another direction and that these terms are independent of the orientation of the SRAM 700. In this embodiment, LxDEC 710 is in a one-to-one correspondence with a row of the cell array 708. The LxDEC 710 activates a corresponding local wordline or lwIH 726 not shown of a block. The LXDEC 710 is controlled by, for example, WIH, bnkL and BitR 742 signals on their respective lines.

Figure 8:
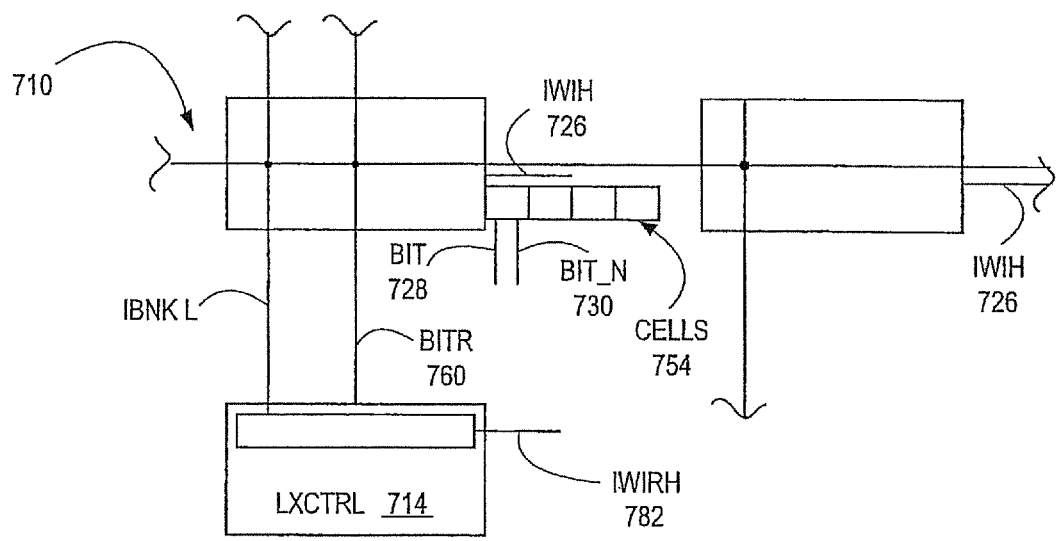
FIG. 8 illustrates a local decoder in accordance with one embodiment of the present invention.

Another embodiment of LxDEC 710 is illustrated in FIG. 8. In this embodiment, each LxDEC 710 in a block interfaces to a unique global wordline 750 (alternatively referred to as "WIH") corresponding to the memory row. The global WIH 750 is shared with other corresponding LxDEC's 710 in the same row block using lwIH 750. LxDEC 710 only activates the local wordline 726, if the corresponding global wordline 750 is activated. It should be appreciated that a plurality of cells 754 similar to the 6T cells discussed previously, are communicatively coupled to the IwIH 726 as illustrated.

In the embodiment illustrated in FIG. 8, every LxDEC 710 in the top or bottom of a sub-block shares the same bank line (alternatively referred to as "bnk Sol H"). It should be appreciated that there are separate bnkL_bot 756 and bnkL_top 758 lines for the bottom and top sub-blocks, respectively. LxDEC 710 will only activate IwIH 726 if this line is active. The bank lines are used to selectively activate different blocks within the same row block and synchronize the proper access timing. For example, during a READ operation, the bank line will activate as early as possible to begin the read operation. During a WRITE operation for example, bnkL is synchronized to the availability of the data on the local bitlines.

Every LxDEC 710 in the embodiment illustrated in FIG. 8 shares the same bitR line 760. This line is precharged to VDD in the memory idle state. When bitR 760 approaches VDD/2 (i.e., one half of VDD), it signals the end of a memory access and causes the LXDEC 710 to de-activate IwIH 726. The bitR signal line 760 is constructed as a replica to the bitlines (i.e, in this embodiment bit line 728 and bit_n line 730 are similar to bit line 628 and bit_n line 630 discussed previously) in the cell array, so the capacitive loading of the bitR 760 line is the same per unit length as in the cell array. In one embodiment, a replica local decoder, controlled by bnkL, fires the IwIRH. In this embodiment, the IwIRH is a synchronization signal that controls the local controller. The IwIRH may fire every time an associated subblock (corresponding to a wIRH) is accessed.

Figure 9:
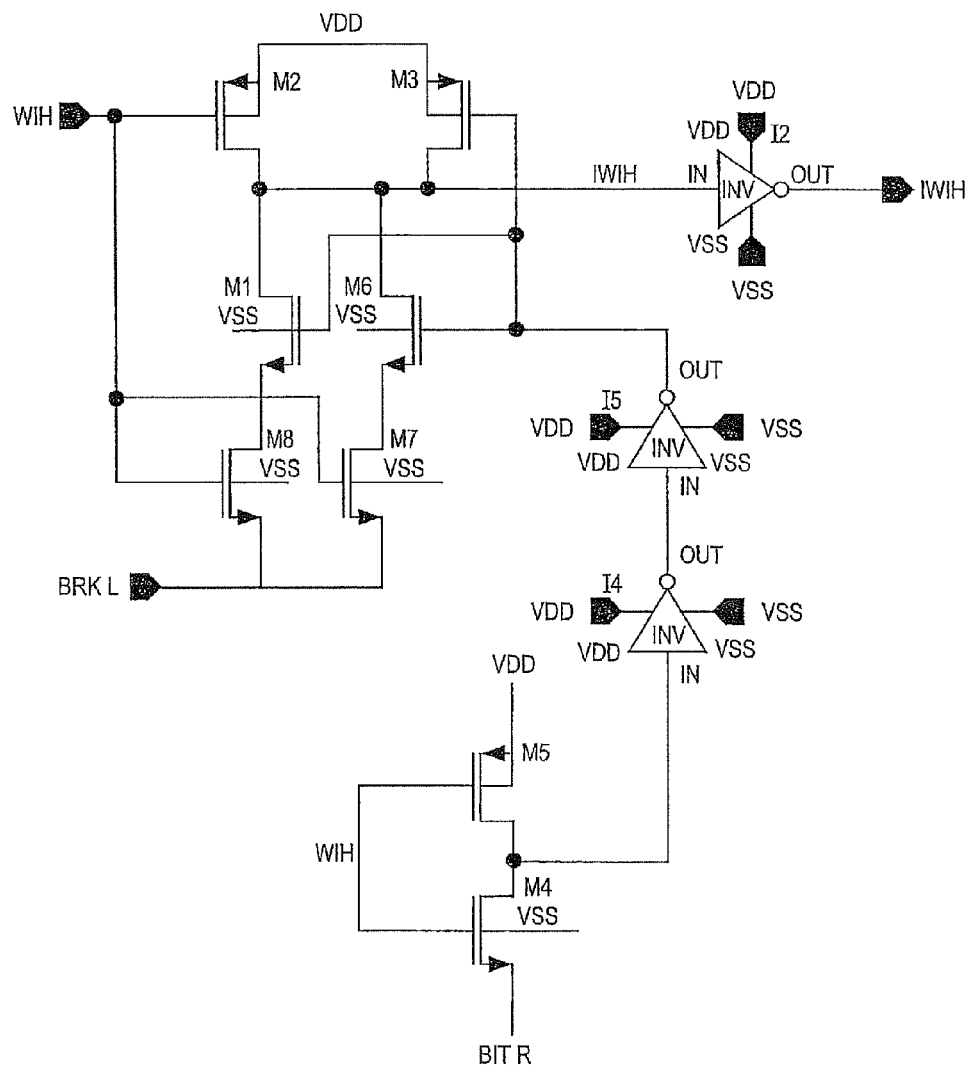
FIG. 9 illustrates a circuit diagram of a local decoder similar to that illustrated in FIG. 8 in accordance with one embodiment of the present invention.

In one embodiment, a global controller initiates or transmits a READ or WRITE signal. The associated local controller 714 initiates or transmits an appropriate signal based on the signal transmitted by the global controller (not shown). The local controller pulls down bitR line 760 from LxDEC 710 when the proper cell is READ from or WRITTEN to, saving power. When the difference between bit line 728 and bit_n line 730 is high enough to trigger the sense amp portion, the IwIH 726 is turned off to save power. A circuit diagram of one embodiment of a local x-decoder similar to LxDEC 710 is illustrated in FIG. 9.

Local Sense-Amps

Figure 10:
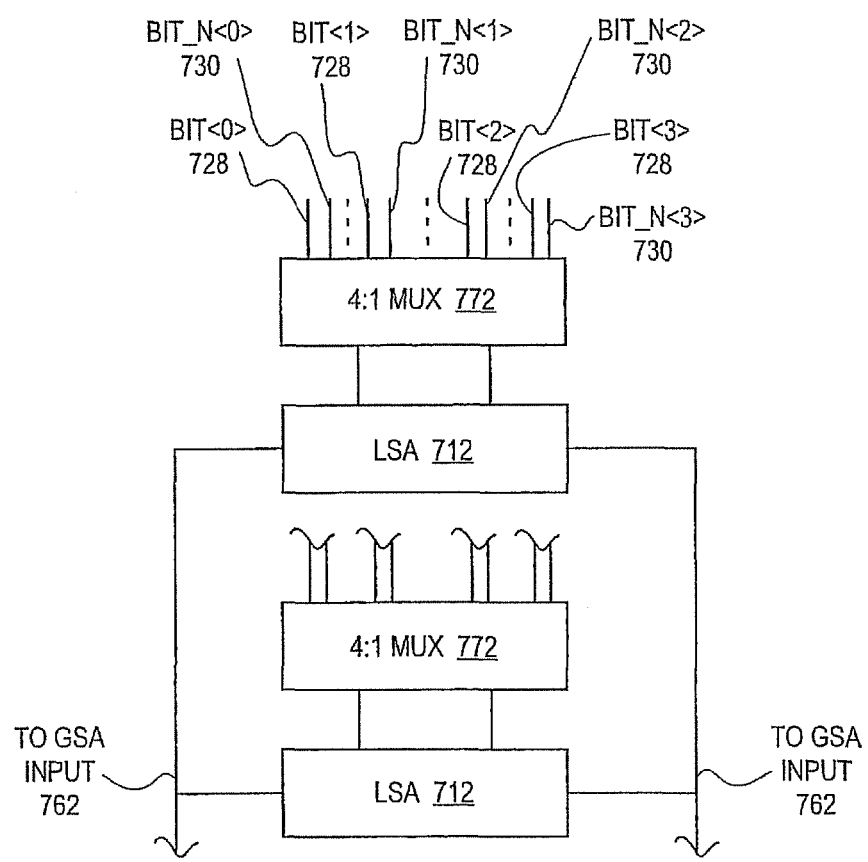
FIG. 10 illustrates a block diagram of the local sense amps and 4:1 muxing in accordance with one embodiment of the present invention.
Figure 11:
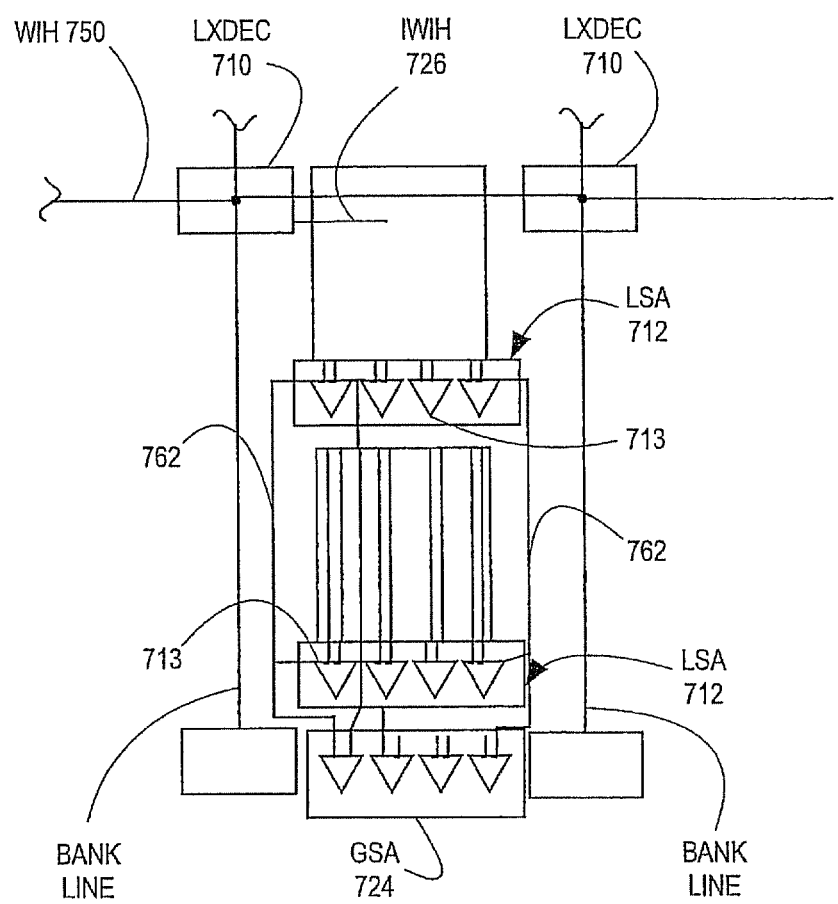
FIG. 11 illustrates a block diagram of the local sense amps and global sense amps in accordance with one embodiment of the present invention.
Figure 12A:
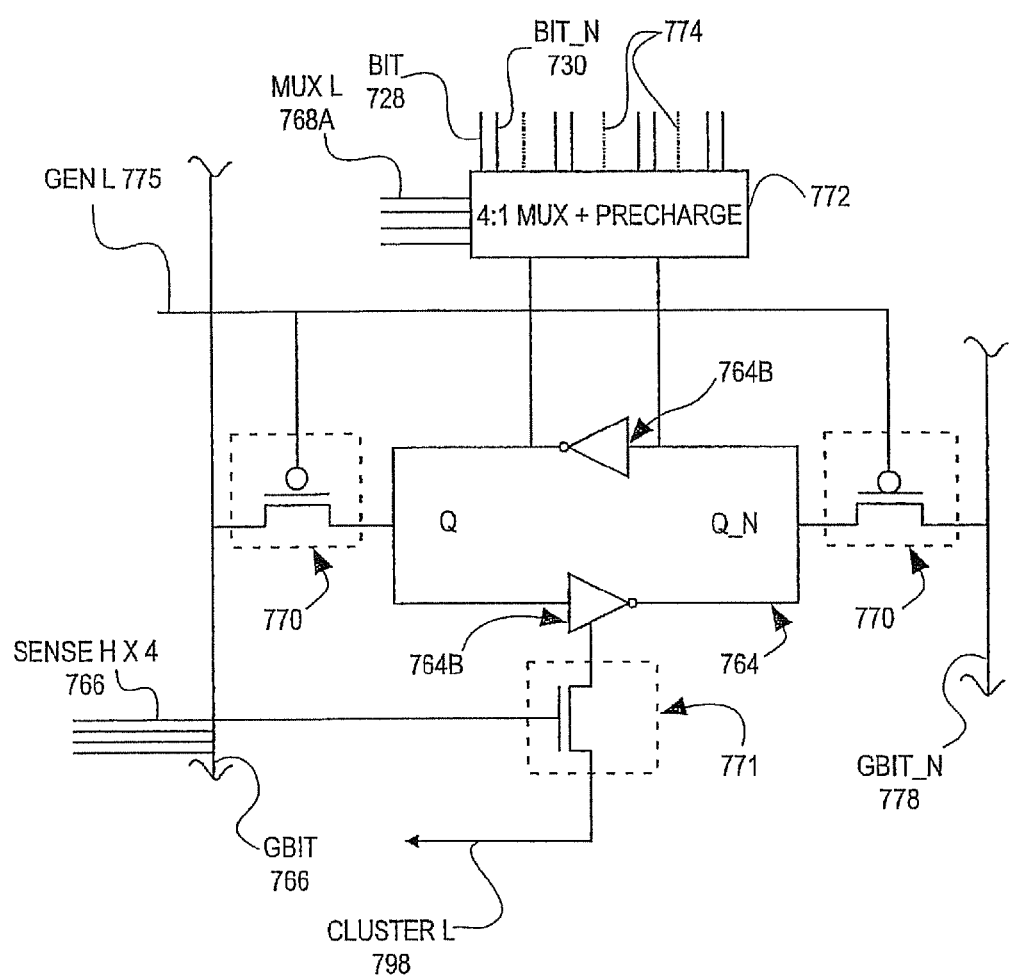
FIG. 12A illustrates a schematic representation of the local sense amps and global sense amps in accordance with one embodiment of the present invention.

One embodiment of the SRAM module includes a one-dimensional array of local sense-amps or LSA's 712 illustrated in FIGS. 10 and 11, where the outputs of the LSA 712 are coupled to the GSA 724 via line 762. In one embodiment, the outputs of the LSA's are coupled to the GSA via at least a pair of gbit and gbit_n lines. FIG. 12A illustrates one embodiment of LSA 712 comprising a central differential cross-coupled amplifier core 764, comprising two inverters 764A and 764B. The senseH lines 766, and clusterL 798, are coupled to the amplifier core through transistor 771.

The LSA's 764 are coupled to one or more 4:1 mux's 772 and eight pairs of muxL lines 768A, four muxLs 768A located above and four 768B (best viewed in FIG. 7) located below the amplifier core 764. In the illustrated embodiment, each of the bitline multiplexers 772 connects a corresponding bitline pair and the amplifier core 764. The gbit and gbit_n are connected to the amplifier core through a PMOS transistors (transistors 770 for example). When a bitline pair is disconnected from the amplifier core 764, the bitline multiplexer 772 actively equalizes and precharges the bitline pair to VDD.

Figure 12B:
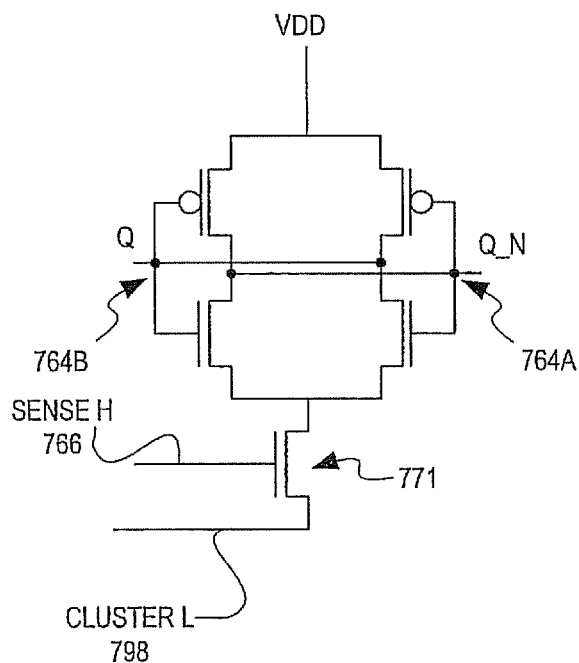
FIG. 12B illustrates a circuit diagram of an embodiment of a local sense amp (similar to the local sense amp of FIG. 12A) in accordance with one embodiment of the present invention.
Figure 12C:
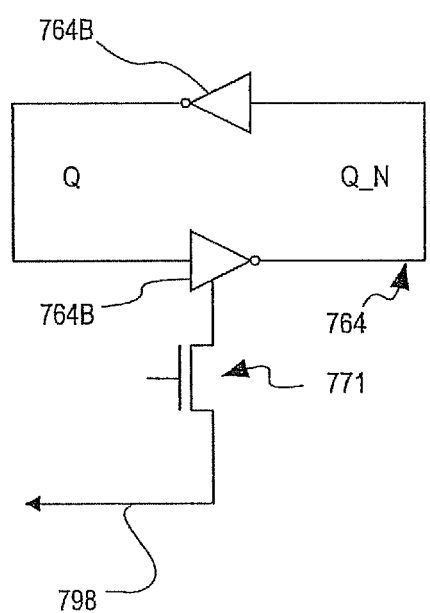
FIG. 12C illustrates a schematic representation of the amplifier core similar to the amplifier core illustrated in FIG. 12B.

FIG. 12B illustrates a circuit diagram of an amplifier core 764 having two inverters 764A and 764B, where each inverter 764A and 764B is coupled to a SenseH line 766 and cluster line 798 through a transistor NMOS 771. Only one sense H cluster lines are illustrated. In the illustrated embodiment, each of the inverters 764A and 764B are represented as coupled PMOS and NMOS transistor as is well known in the art. FIG. 12C illustrates a schematic representation of the amplifier core of FIG. 12B (similar to the amplifier core of FIG. 12A).

Figure 13:
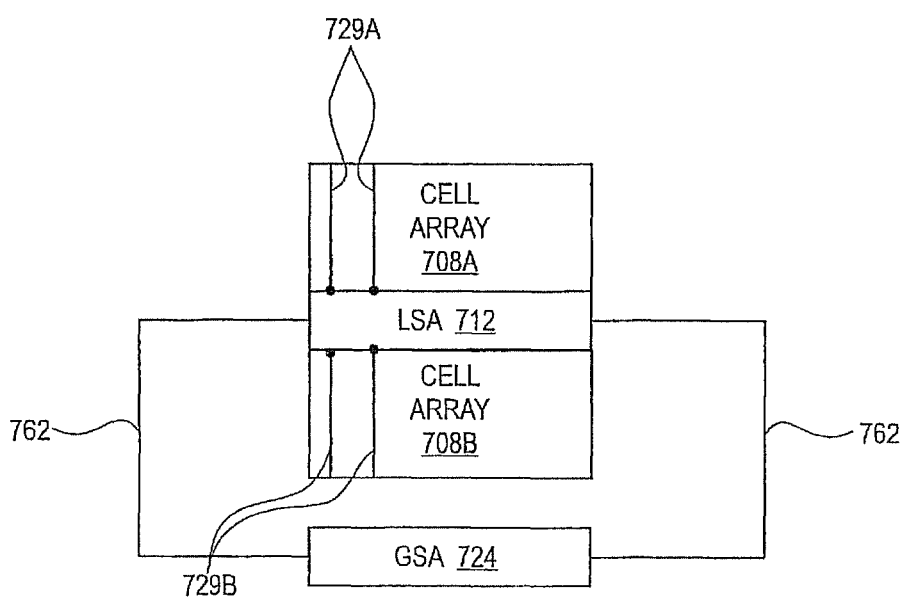
FIG. 13 illustrates a block diagram of another embodiment of the local sense amps and global sense amps in accordance with one embodiment of the present invention.

In one embodiment illustrated in FIG. 13, the sense-amp array comprises a horizontal array of sense—amps 713 located in the middle of the cell array 708, splitting the cell array into top 708A and bottom 708B sub-blocks as provided previously. In this embodiment, the width of a single LSA 712 is four times the width of the cell array, while the number of LSA 712 instances in the array is equal to the number of cols/4. That is, each LSA 712 (and in one embodiment one 4:1 mux) is in a one-to-one correspondence with four columns of the cell array and interfaces with the corresponding local bitline-pairs of the cell array 708 in the top and bottom sub-blocks 708A, 708B. This arrangement is designated 4:1 local multiplexing (alternatively referred to as "4:1 local muxing"). It should be appreciated that the bitline-pairs of the bottom sub-block 708B are split from the top sub-block 708A, thereby reducing the capacitive load of each bitline 729 by a factor of two, increasing the speed of the bitline by the same factor and decreasing power. One embodiment of the 4:1 mux plus precharge is illustrated in FIGS. 10 and 12 and discussed in greater detail below.

It is currently known to intersperse power rails 774 (shown in phantom) between pairs of bitlines to shield the bitline pairs from nearby pairs. This prevents signals on one pair of bitlines from affecting the neighboring bitline pairs. In this embodiment, when a pair of bitlines 729 (bit and bit_n, 728, 730) is accessed, all the neighboring bitlines are precharged to VDD by the 4:1 mux as illustrated in FIG. 12. Precharging the neighboring bitlines, eliminates the need for shields to isolate those bitlines. This means that it is not necessary to isolate pairs of bitlines from each other using with interspersed power rails 774. This allows for a larger bitline pitch in the same total width, and therefore less capacitance, less power, and higher speed.

The LSA 712 interfaces with a pair of global bitlines, designated gbit 776 and gbit_n 778 via a PMOS transistors 770 as illustrated in FIG. 12A. Two PMOS transistors are illustrated, but any number is contemplated. In one embodiment, the global bitlines run vertically in parallel with the local bitlines. The global bitlines are shared with the corresponding local sense-amps 712 in other blocks in the same column block. In one embodiment, the local bitlines and global bitlines are routed on different metal layers. Because there are four times fewer global bitlines than local bitlines, the global bitlines are physically wider and placed on a larger pitch. This significantly reduces the resistance and capacitance of the long global bitlines, increasing the speed and reliability of the SRAM module. The PMOS transistors 770 isolate global bitlines 776, 778 from the sense amp.

Figure 14:
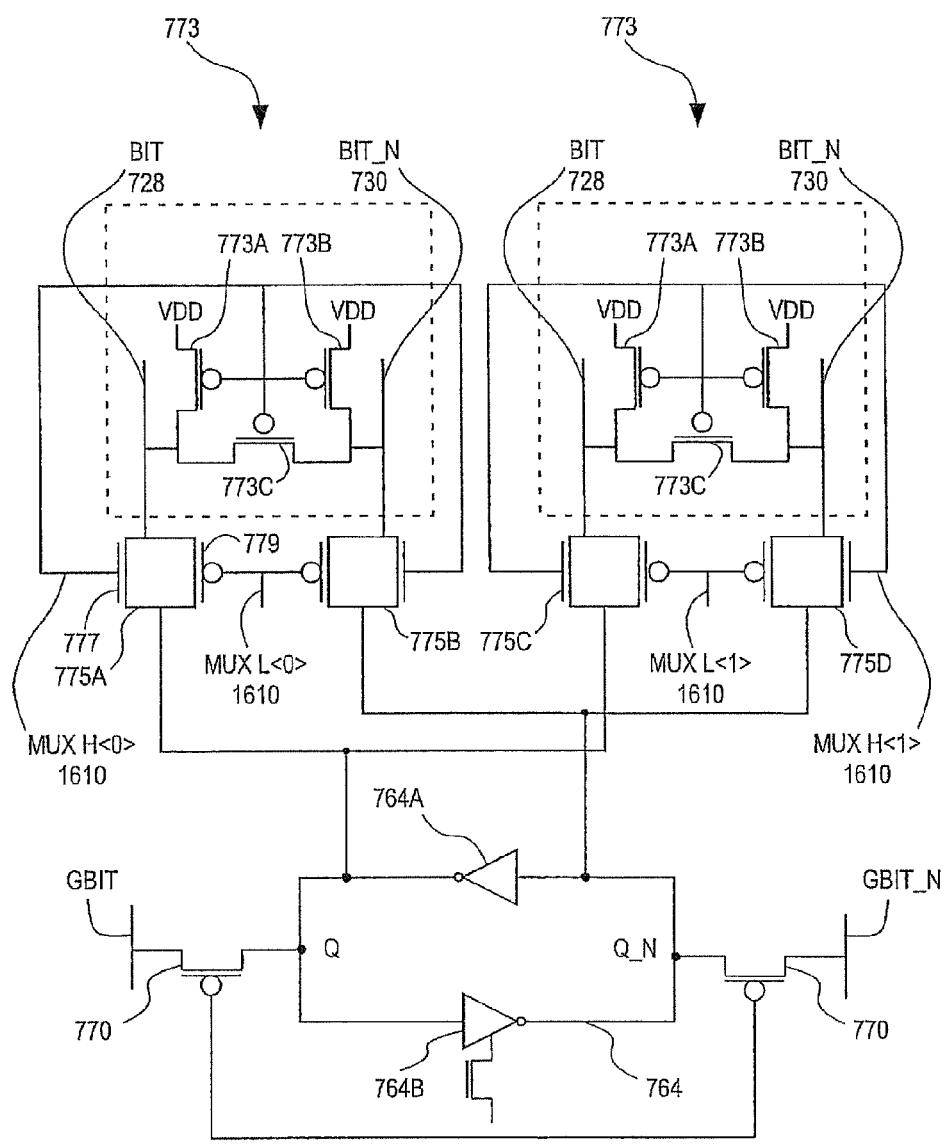
FIG. 14 illustrates a circuit diagram including a transmission gate of the 4:1 mux similar to that illustrated in FIGS. 10 and 12 in accordance with one embodiment of the present invention.

One embodiment of the bitline multiplexer or 4:1 mux 772 is illustrated in FIG. 14. In this embodiment, the 4:1 mux 772 comprises a precharge and equalizing portion or device 773 and two transmission gates per bit/bit_n pair. More specifically, 4:1 muxing may comprise 8 transmission gates and 4 precharge and equalizers, although only 4 transmission gates and 2 precharge and equalizers are illustrated.

In the illustrated embodiment, each precharge and equalizing portion 773 of the 4:1 mux comprises three PFet transistors 773A, 773B and 773C. In this embodiment, the precharge portion comprises PFet transistors 773A and 773B. The equalizing portion comprises PFet transistor 773D.

Figure 15:
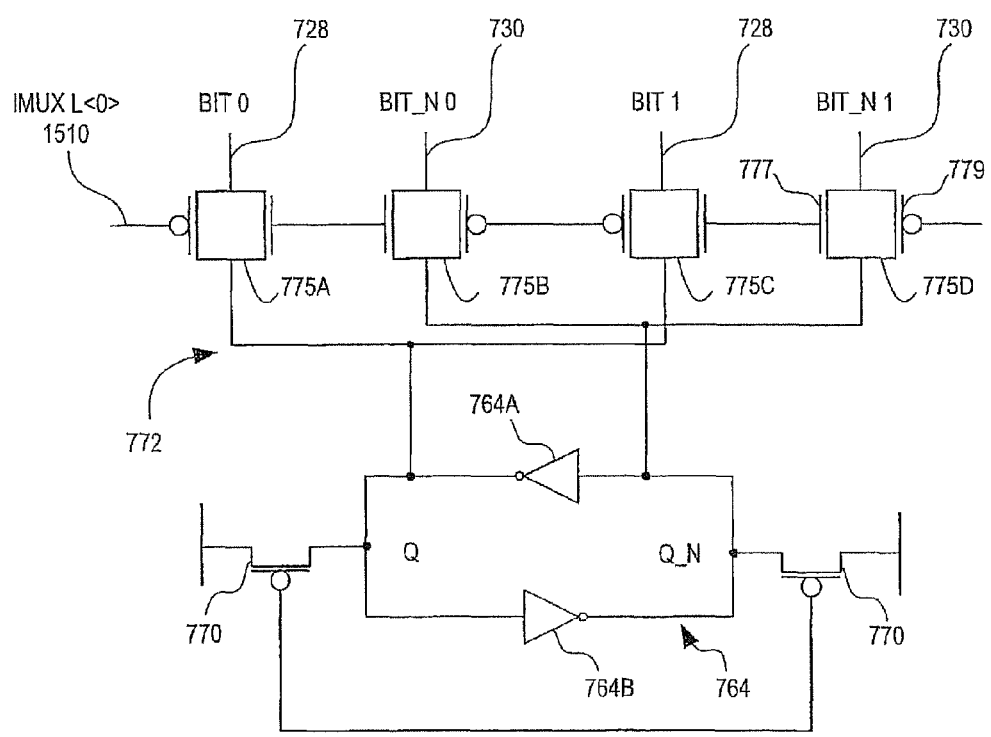
FIG. 15 illustrates transmission gates of the 2:1 mux coupled to the inverters of a local sense amp in accordance with one embodiment of the present invention.
Figure 16:
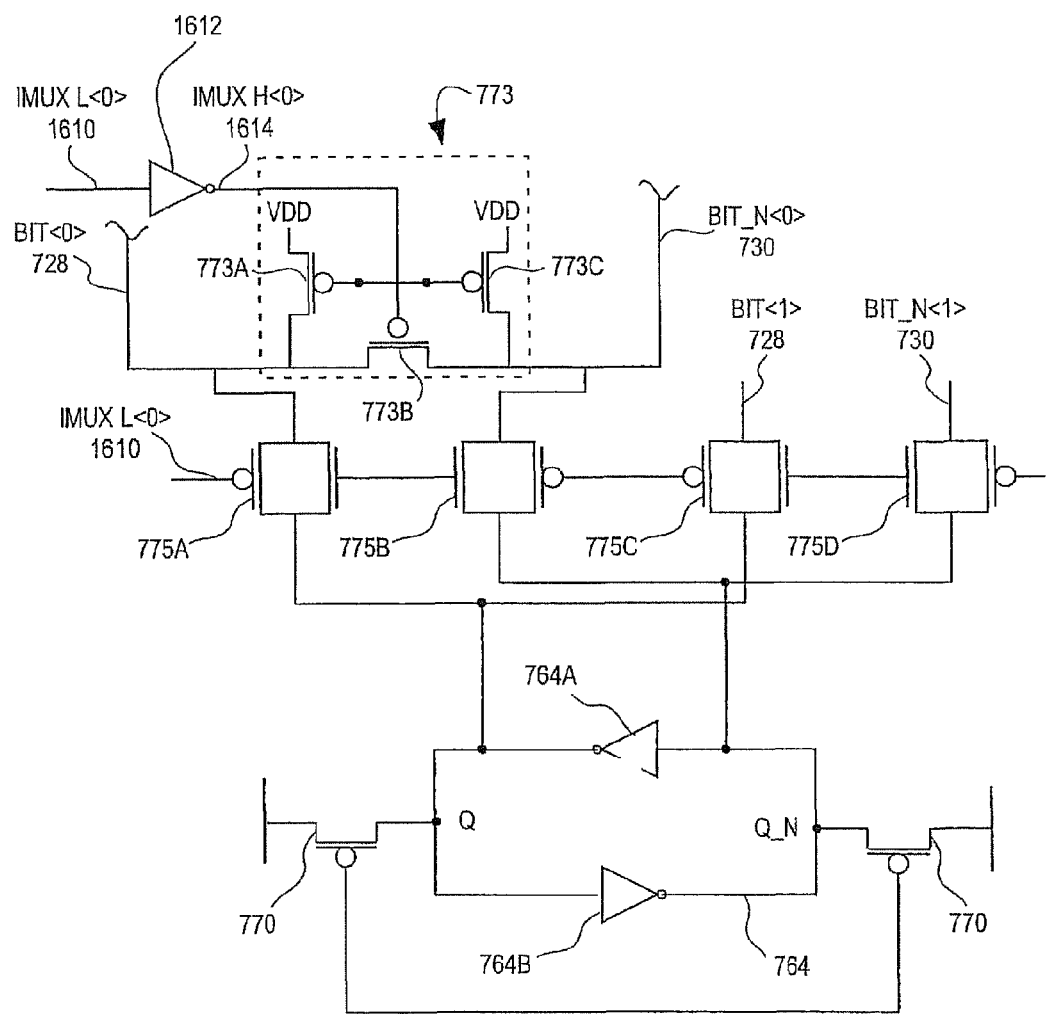
FIG. 16 illustrates the precharge and equalizing portions and transmission gates of the 2:1 mux coupled to the inverters of a local sense amp in accordance with one embodiment of the present invention.

In the illustrated embodiment, each transmission gate comprises one NFet 777A and one PFet 777B transistor. While a specific number and arrangement of PMOS and NMOS transistors are discussed, different numbers and arrangements are contemplated. The precharge and equalizing portion 773 is adapted to precharge and equalize the bitlines 728, 739 as provided previously. The transmission gate 775 is adapted to pass both logic "1'"s and "0'"s as is well understood in the art. The NFet transistors, 777A and 777B for example, may pass signals during a WRITE operation, while the PFet transistors 779A and 779B may pass signals during a READ operation. FIGS. 15 and 16 illustrate embodiments of the 2:1 mux 772 coupled to the amplifier core 764 of the LSA. FIG. 15 also illustrates an alternate representation of the transmission gate. Here, four transmission gates 775A, 775B, 775C and 775D are illustrated coupled to the inverters 764A and 764B of the inverter core. In one embodiment of the present invention, eight transmission gates are contemplated for each LSA, two for each bitline pair.

FIG. 16 illustrates the precharge and equalizing portion 773 of the 2:1 coupled to the transmission gates 775A and 775B of mux 772, which in turn is coupled to the amplifier core. While only one precharge and equalizing portion 773 is illustrated, it is contemplated that a second precharge and equalizing portion 773 is coupled to the transmission gates 775C and 775D.

In one embodiment illustrated in FIG. 7, the LSA 712 is controlled by the following set of lines, or signals on those lines, that are shared across the entire LSA 712 array: (1) muxL_bot 768B; (2) muxL_top 768A; (3) senseH 766; (4) genL 780; and (5) IwIRH 782. In one embodiment of the SRAM module, the LSA 712 selects which of the local bitlines to use to initiate or access the cell array 708. The local bitlines comprise 8 pairs of lines, 4 pairs of mux lines 768B that interface to the bottom sub-block 708B (alternatively referred to as "muxL_bot 765B<0:3>") and 4 pairs of mux lines 768A that interface to the top sub-block 708A (alternatively referred to as "muxL_top 765A<0:3>"). The LSA 712 selects which of the 8 pairs of local bitlines to use for the current access. The LSA 712 maintains any local bitline not selected for access in a precharged and equalized state. In one embodiment, the LSA 712 keeps the non-selected bitlines precharged to VDD.

The LSA 712 also activates the amplifier portion of the sense-amp 713 using a sense enable line 766 or signal on the line (alternatively referred to as "senseH 766") connected to transistor 773. This activation signal is distributed into four separate signals, each signal tapping one out of every four local sense-amps. In one embodiment, the local controller 714 may activate all the senseH lines 766 simultaneously (designated "1:1 global multiplexing" or "1:1 global mux") because every sense-amp 713 is activated by senseH lines 766 for each access. Alternately, the local controller may activate the senseH lines 766 in pairs (designated "2:1 global multiplexing" or "2:1 global mux") because every other sense-amp 713 is activated by senseH 766 for each access. Additionally, the LSA 712 may activate the senseH 766 lines 766 individually (designated "4:1 global multiplexing" or "4:1 global mux"), because every fourth sense-amp is activated for each access. It should be appreciated that connecting or interfacing the senseH 766 to every fourth enabled transistor in 4:1 global multiplexing provides for more configurable arrangements for different memory sizes.

The LSA 712, in one embodiment, exposes the sense-amps 713 to the global bitlines. The LSA 712 activates or initiates the genL line 780, thus exposing the sense amps 713 to the gbit and gbit_n.

In one embodiment, the LSA 712 replicates the poly local wordline running through each row of each block. This replicated line is referred to as a dummy poly line 782 (alternatively referred to as "IwIRH 782"). In this embodiment, the IwIRH line 782 forms the gate of dummy transistors that terminate each column of the cell array 708. Each dummy transistor replicates the access transistor of the 6T SRAM cell. The capacitive load of this line is used to replicate the timing characteristics of an actual local wordline.

Figure 17:
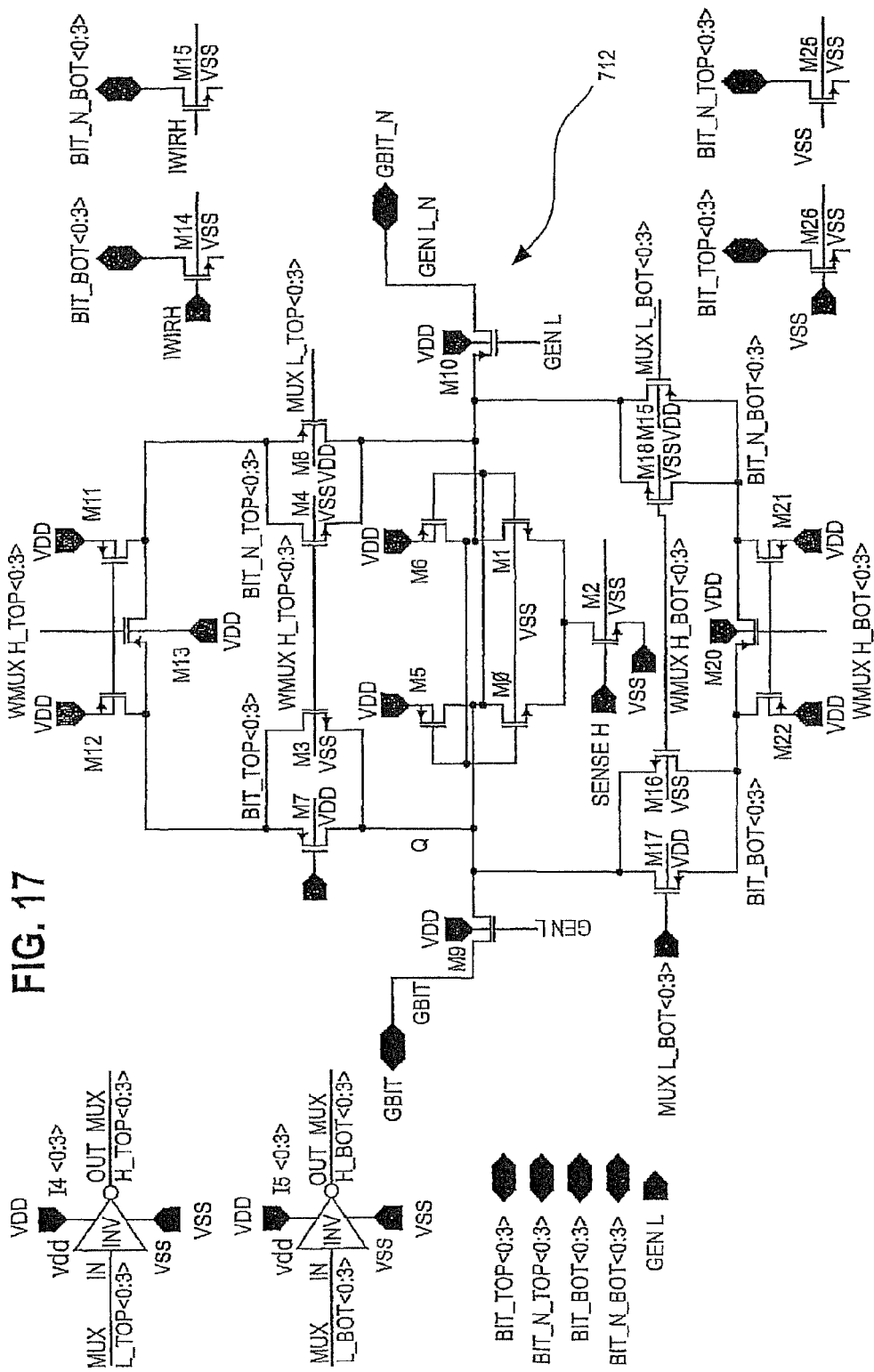
FIG. 17 illustrates a circuit diagram of the local sense amp in accordance with one embodiment of the present invention.

It is contemplated that, in one embodiment, the replica IwIRH line 782 also extends to the metal jumper line (not shown). The replica jumper line has the same width and neighbor metal spacing as any local wordline jumper in the cell array. This line is used strictly as a capacitive load by the local controller 714 and does not impact the function of the LSA 712 in any way. More specifically, the replica jump line is adapted to reduce the resistance of the IwIRH poly line similar to the metal shunt line as provided earlier. A circuit diagram of one embodiment of an LSA 712 is illustrated in FIG. 17.

Local Controller

Figure 18:
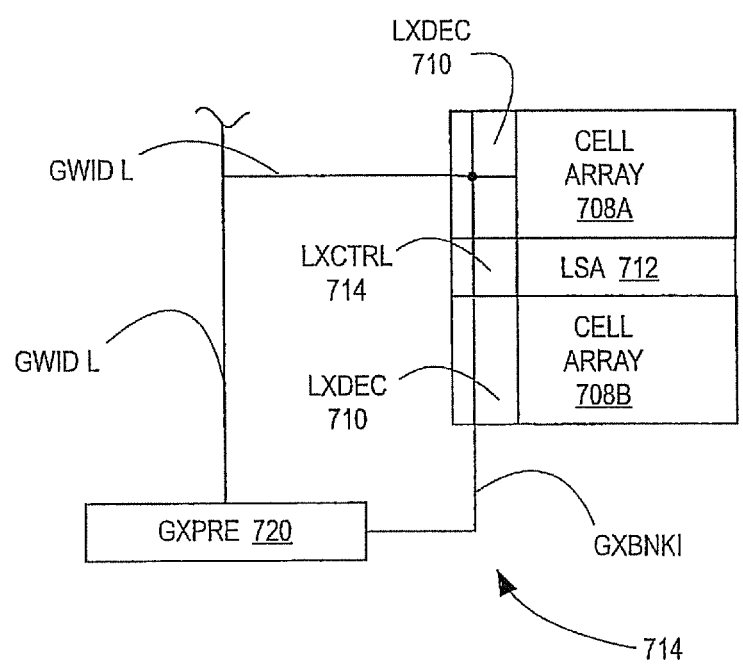
FIG. 18 illustrates a block diagram of a local controller in accordance with one embodiment of the present invention.

In one embodiment, each block has a single local controller or LxCTRL 714 as illustrated in FIGS. 7 and 18 that coordinates the activities of the local x-decoders 710 and sense-amps 713. In this embodiment, the LxCTRL 714 coordinates such activities by exercising certain lines including: (1) the bitR 760; (2) the bnkL_bot 756; (3) the bnkL_top 758; (4) the muxL_bot 765B; (5) the muxL_top 765A; (6) the senseH 766; (7) the genL 780; and (8) the IwIRH 782 control lines as illustrated in FIG. 7. Each of these lines is activated by a driver and control logic circuit in the LxCTRL circuit 714. In one embodiment, all these lines are normally inactivate when the SRAM module is in the idle state except for the genL line 780. The genL line 780 is active in the idle state. The LxCTRL 714 circuit is in turn activated by external Vertical and Horizontal signals. Vertical signals include: (1) lmuxL 784; (2) gmuxL 786; (3) rbankL 788; (4) gbitR 760; and (5) wbankL 792 signals. Horizontal signals include: (1) wIRH 794; (2) blkSeIH_bot 756; and (3) blkSeIH_top 758.

In one embodiment, all LxCTRL 714 circuits in the same column block share the Vertical signals. In this embodiment, the LxCTRL 714 in each block interfaces with four local mux lines 784 (alternatively referred to as "lmuxL<0:3>" or "lmuxl"). Only one of the four lmuxL lines 768 is active at any time. The LxCTRL 714 initiates or activates one lmuxL lines 768 to access a cell array 708, selecting one of the four cell array columns interfaced to each LSA 712 for access.

In one embodiment, similar to that discussed previously, the LSA 712 may activate the senseH 766 signals individually (i.e., 4:1 global multiplexing). In this embodiment, the LxCTRL 714 in each block interfaces with four global mux lines 786 (alternatively referred to as "gmuxL<0:3>" or "gmuxl"). It should be appreciated that only one of these four gmuxL lines 768 is active at any time, selecting or activating one out of every four global bitlines for access. In one embodiment the LSA 712 activates the senseH lines 766 in pairs (i.e., 2:1 global multiplexing). In this embodiment only two of the four gmuxL lines 768 are active at any time, selecting one out of every two global bitlines for access. For 1:1 global muxing, all four gmuxL lines 786 are always active, selecting all the global bitlines for access.

All LxCTRL circuits 714 in the same column block share the same read bank lines 788 or signals on the lines (alternatively designated "rbankL"). The rbankL line 788 is activated when a READ operation is requested (i.e., data is read from the block). At the end of the READ operation, the global bitlines selected by the gmuxL line 768s 786 contain limited swing differential signals. This limited swing differential signals represent the stored values in the cells selected by the IwIH line 726 and the lmuxL lines 784.

In one embodiment, a global bit replica line 790 or signal on the line is shared with all the LxCTRL circuits 714 in the same column block (alternatively designated "gbitR"). The gbitR line 760 is maintained externally at VDD when the SRAM memory is idle. The gbitR line 760 is made floating when a READ access is initiated. The LxCTRL 714 discharges this signal to VSS when a READ access request is concluded synchronous with the availability of READ data on gbit/gbit_n.

During a WRITE operation, the LxCTRL 714 activates write bank lines 792 or signals on the line (alternatively referred to as "wbnkL"). Limited swing differential signals are present on the global bitlines when the wbnkL line 792 is activated. The limited swing differential signals represent the data to be written.

It should be further appreciated that, in one embodiment, all the LxCTRL circuits 714 in the same row block column share the Horizontal signals. In one embodiment, all the LxCTRL 714 circuits share a replica of the global wordline wIH line 794 (alternatively referred to as "wIRH") that runs through each row of the memory. The physical layout of the wIRH line 794 replicates the global wordline in each row with respect to metal layer, width, and spacing. Thus the capacitive loading of the wIRH 794 and the global wIH signal are the same. On every memory access, the wIRH line 794 is activated simultaneously with a single global wIH for one row in the block.

Figure 19:
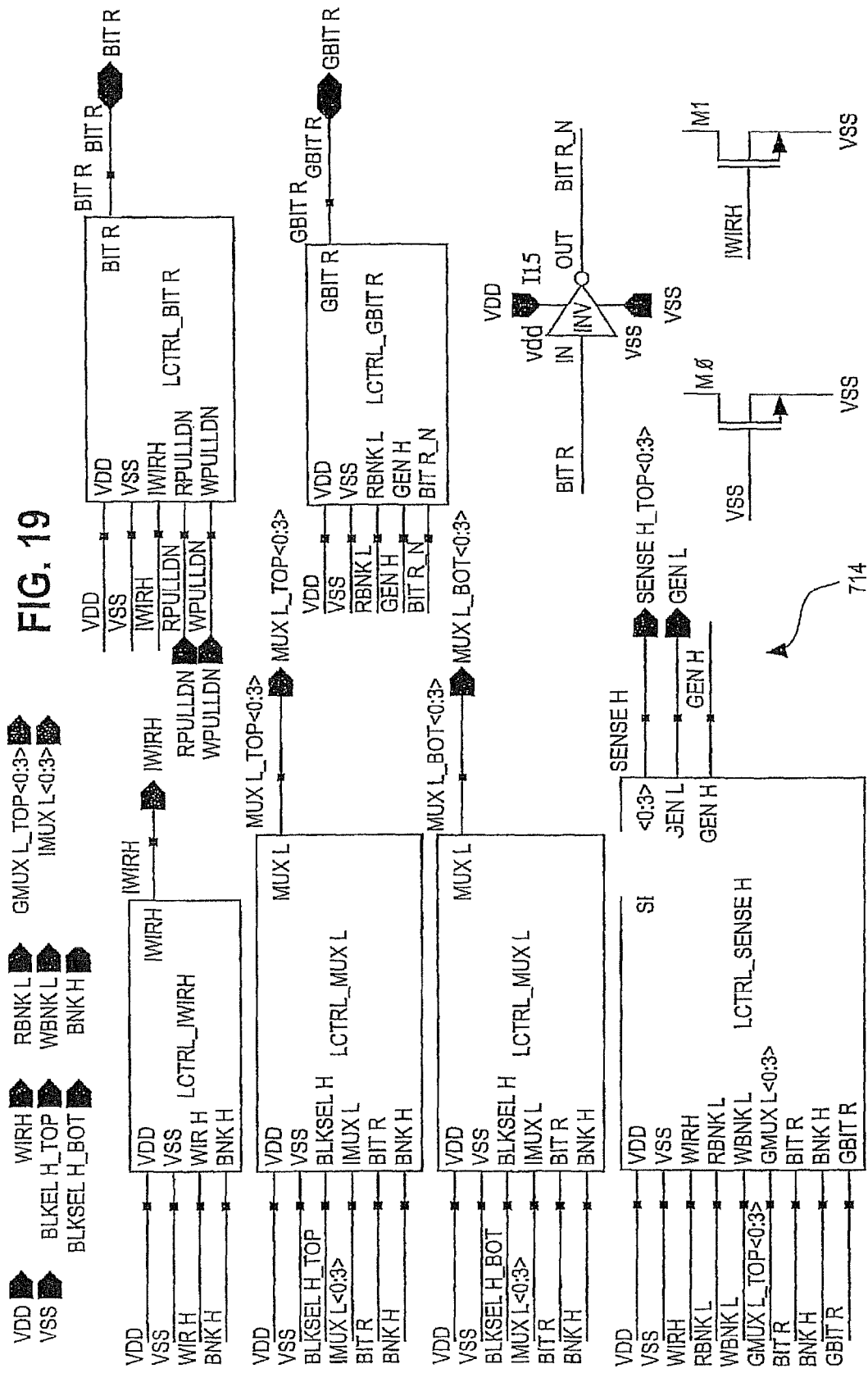
FIG. 19 illustrates a circuit diagram of the local controller in accordance one embodiment of the present invention.

The LxCTRL 714 indicates to the block whether the bottom or top sub-block 706B, 706A is being accessed using either the blkSeIH_bot 756 or blkSeIH_top 758 line or signals on the lines. Either one of these lines is active upon every memory access to the block, indicating whether the bottom sub-block 706B or top sub-block 706A transmission gates in the LSA 712 should be opened. A circuit diagram for one embodiment of the local controller is illustrated in FIG. 19.

Synchronous Control of the Self-Timed Local Block

One embodiment of the present invention includes one or more global elements or devices that are synchronously controlled while one or more local elements are asynchronously controlled (alternatively referred to as "self-timed"). It should be appreciated that the term synchronous control means that these devices are controlled or synchronous with a clock pulse provided by a clock or some other outside timing device. One advantage to having a synchronous control of elements or devices on the global level is those elements, which are affected by resistance, may be adjusted.

For example, slowing or changing the clock pulse, slows or changes the synchronous signal. Slowing or changing the synchronous signal slows or changes those devices or elements controlled by the synchronous signals, providing more time for such devices to act, enabling them to complete their designated function. In one embodiment, the global controller is synchronous. In another embodiment, the global controller, the global decoder and the global sense amps are synchronous.

Alternatively, the local devices or elements are asynchronous controlled or self-timed. The self-timed devices are those devices where there is little RC effects. Asynchronous controlled devices are generally faster, consume less power. In one embodiment, the local block, generally including the local controller, local decoder, local sense amps, the sense enable high and the cell arrays, are asynchronously controlled.

Read Cycle Timing

Cycle timing for a read operation in accordance with one embodiment of the present invention includes the global controller transmitting or providing a high signal and causing LwIH line to fire and one or more memory cells is selected. Upon receiving a signal on the LwIH line, one or more of the bit/bit_n line pairs are exposed and decay (alternatively referred to as the "integration time"). At or about the same time as the bit/bit_n begin to decay, bitR begins to decay (i.e. upon receiving a high signal on the IwIRH line). However, the bitR decays approximately 5 to 6 times faster than the bit/bit_n, stopping integration before the bit/bit-n decays completely (i.e., sensing a swing line voltage) and initiates amplifying the voltage.

BitR triggers one or more of the SenseH lines. Depending on the muxing, all four SenseH lines fire (1:1 muxing), two SenseH lines fire (2:1 muxing) or one SenseH line fires (4:1 muxing).

After the SenseH line signal fires, the sense amp resolves the data, the global enable Low or genL line is activated (i.e., a low signal is transmitted on genL). Activating the genL line exposes the local sense amp to the global bit and bit_n. The genL signal also starts the decay of the signal on the gbitR line. Again, the gbitR signal decays about 5 to 6 times faster than gbit signal, which turns off the pull down of the gbit. In one embodiment gbitR signal decays about 5 to 6 times faster than gbit signal so that signal on the gbit line only decays to about 10% of VDD before it is turned off.

The signal on gbitR shuts off the signal on the SenseH line and triggers the global sense amp. In other words the signal on the gbitR shuts off the local sense amp, stopping the pull down on the gbit and gbit_n lines. In one embodiment, the SenseH signal is totally asynchronous.

Figure 20:
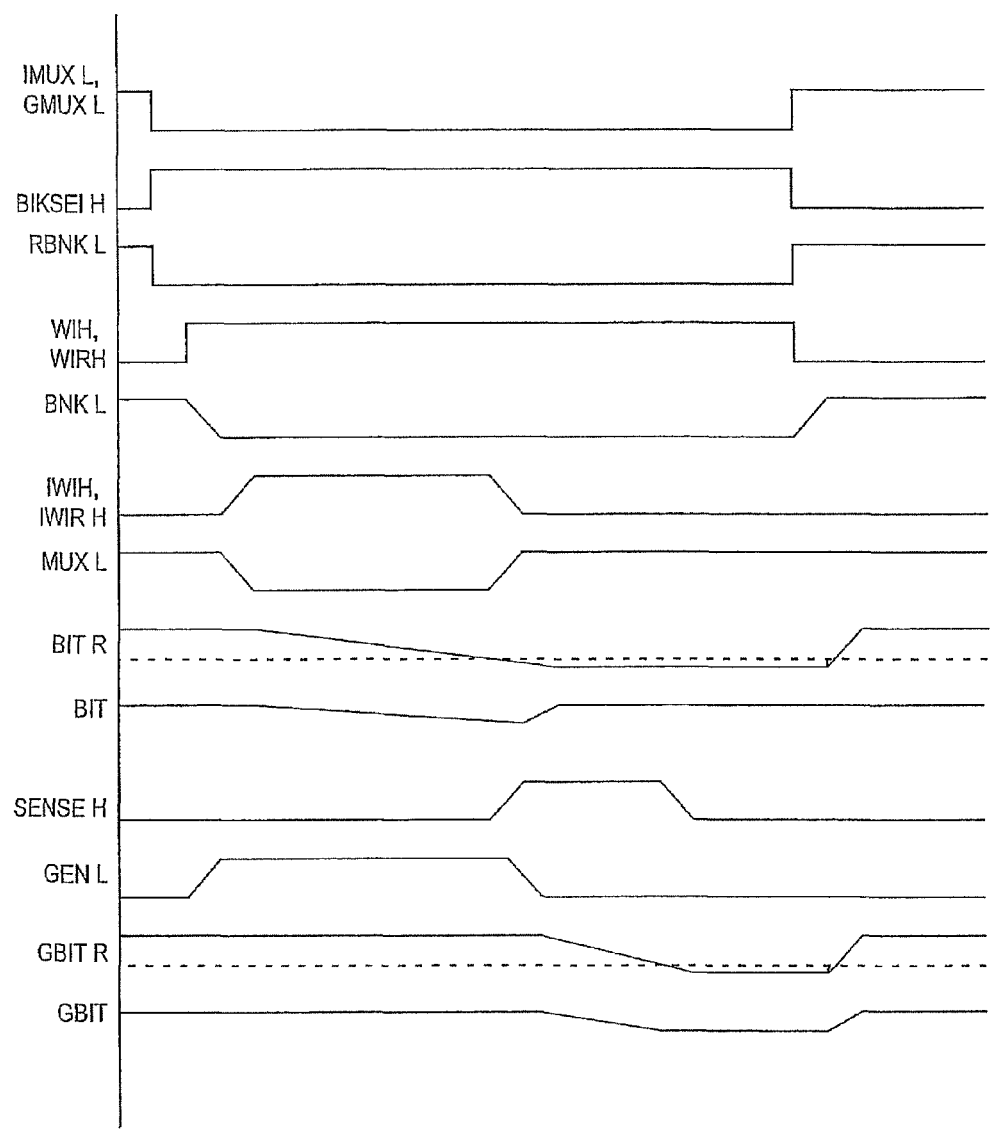
FIG. 20 illustrates the timing for a READ cycle using a SRAM memory module in accordance with one embodiment of the present invention.

The cycle timing for a READ operation using one embodiment of the present invention (similar to that of FIG. 7) is illustrated in FIG. 20. During the READ operation, one of the four lmuxL<0:3> lines 784 are activated, selecting one of the four cell array columns supported by each LSA 712. One, two, or four gmuxL<0:3> lines 786 are activated to select every fourth, every second, or every global bitline for access, depending on the global multiplexing option (i.e., 4:1, 2:1 or 1:1 muxing.

Either the blkSeIH_bot 756 or blkSeIH_top 758 is activated to indicate to the block that the bottom or top sub-block 706B, 706A respectively is being accessed. The rbankL line 788 line is activated to request a read operation from the block. The wIH line is activated for the memory row that is being accessed, while the wIRH line 794 is activated simultaneously for all the blocks in the row block containing the memory row.

The LxCTRL 714 deactivates the genL line 780 to isolate the local sense-amps from the global bitlines. The LxCTRL 714 activates the bnkL line to signal the LxDEC 710 to activate a local wordline. The LxCTRL 714 activates one of the four muxL<0:3> line corresponding to the activated muxL signal. This causes the LSA 712 to connect one of the four cell columns to the sense-amp amplifier core 762. The LxDEC 710 corresponding to the activated global wordline activates the local wordline. Simultaneously, the LxCTRL 714 activates the IwIRH line 794 782. All the cells in the row corresponding to the activated local wordline begin to discharge one bitline in each bitline pair corresponding to the stored value of the 6Tcell.

After a predetermined period of time a sufficient differential voltage is developed across each bitline pair. In one example, a differential voltage of about 100 mV is sufficient. It should be appreciated that this predetermined period of time is dependant on process corner, junction temperature, power supply, and the height of the cell array.

Simultaneously, the IwIRH 782 signal causes the LxCTRL 714 to discharge the bitR line 760 with an NMOS transistor that draws a certain current at a fixed multiple of the cell current. The bitR 760 line therefore discharges at a rate that is proportional to the bitline discharge rate. It should be appreciated that the constant of proportionality is invariant (to a first order) with regards to process corner, junction temperature, power supply, and the height of the cell array 708.

When the bitR signal 760 crosses a predetermined threshold, the LxDEC 710 deactivates the local wordline and the 6T cells stop discharging through the bitlines. In this manner, a limited swing differential voltage is generated across the bitlines independent (to a first order) of the process corner, junction temperature, power supply, and the height of the cell array. In one example, a differential voltage of about 100 mV is sufficient. Simultaneously, the LxCTRL 714 deactivates the muxL line 768 so that the corresponding bitlines are disconnected from the amplifier core 762 and are equalized and precharged.

At the same time that the LxCTRL 714 deactivates the muxL line 768, the LxCTRL 714 activates the senseH lines 766 and, depending on the global multiplexing, the amplifier core 762 rapidly amplifies the differential signal across the sensing nodes. As soon as the amplifier core 762 has started to sense the differential signal, the LxCTRL 714 activates the genL line 780 so that the local sense-amps are connected to the global bitlines. The amplifier core 762, depending on the global multiplexing, continues to amplify the differential signals onto the global bitlines. The LxCTRL 714 discharges the gbitR 760 signal to signal the end of the READ operation. When the gbitR 760 signal crosses a predetermined threshold, the LxCTRL 714 deactivates the senseH 766 signals and the amplifier core 762 of the LSA array stop amplifying. This results in a limited-swing differential signal on the global bitlines representative of the data read from the cells.

When the wIRH line 794 is deactivated, the LxCTRL 714 precharges the bitR line 760 to prepare for the next access. When the rbankL line 788 is deactivated, the LxCTRL 714 deactivates the bnkL line to prepare for the next access.

Write Cycle Timing

Cycle timing for a write operation in accordance with one embodiment of the present invention includes the global controller and global sense amp receiving data or a signal transmitted on wbnkL, transmitting or providing a high signal on an LwIH line and selecting one or more memory cells. The write operation is complete when the local word line is high.

Data to be written into a memory cell is put onto the gbit line synchronously with wbnkL. In this embodiment, the wbnkL acts as the gbitR line in the write operation. In this embodiment, the wbnkL pulls down at the same time as gbit but about 5 to 6 times faster.

The low signal on the wbnkL line triggers a signal on the SenseH and a local sense amp. In other words, genL goes high, isolating the local sense amp. A signal on the wbnkL also triggers bnkL, so that IwIH goes high when wIH arrives. After the signal on the SenseH is transmitted, the lmux switch opens, so that data from the local sense amplifier onto the local bitlines. BitR is pulled down. In one embodiment, bitR is pulled down at the same rate as bit. In other words BitR and bit are pull down at the same rate storing a full BDT. LwIL goes high and overlaps the data on the bitlines. BitR turns off LwIH and closes the lmux switch and SenseH.

Figure 21:
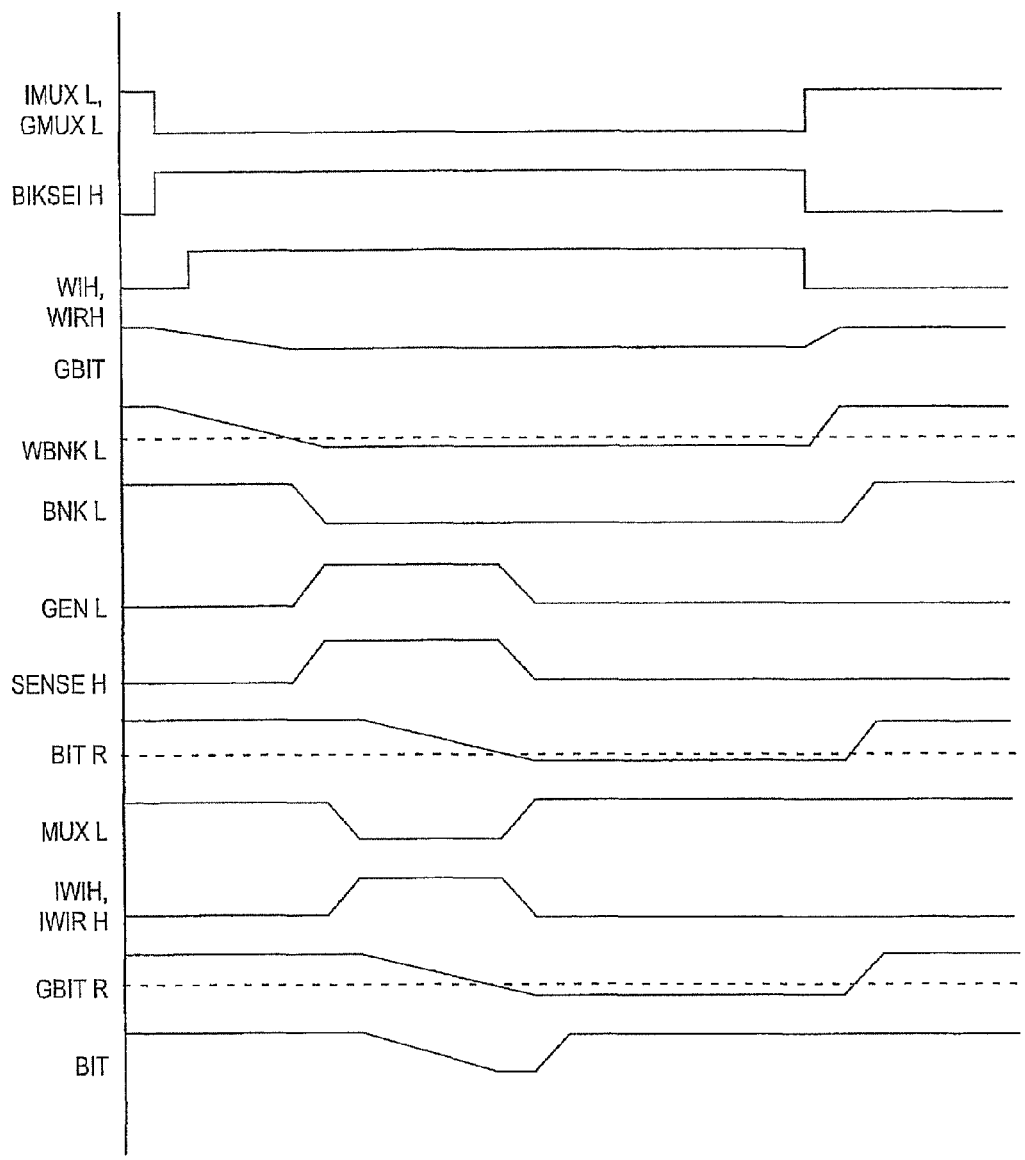
FIG. 21 illustrates the timing for a WRITE cycle using a SRAM memory module in accordance with one embodiment of the present invention.

The cycle timing for a WRITE operation using one embodiment of the present invention is illustrated in FIG. 21. One of four lmuxL<0:3> lines 784 is activated to select one of the four cell array columns supported by each LSA 712. One, two, or four gmuxL<0:3> lines 786 are activated to select every fourth, every second, or every global bitline for access (i.e., 4:1, 2:1 or 1:1 muxing) depending on the global multiplexing option. The blkSeIH_bot 756 or blkSeIH_top 758 line is activated to indicate to the block whether the bottom 706B or top sub-block 706A is being accessed. The global word line is activated for a particular memory row being accessed.

The wIRH line 794 is activated simultaneously for all the blocks in the row block containing the memory row. The GSA 724 presents limited swing or full swing differential data on the global bit lines. The wbnkL line 792 is activated to request a WRITE operation to the block. The LxCTRL 714 immediately activates the senseH lines 766 depending on the global multiplexing, and the amplifier core 762 rapidly amplifies the differential signal across the sensing nodes. Only the data from global bitlines selected by the global multiplexing are amplified.

The LxCTRL 714 activates the bnkL line to signal the LXDEC 710 to activate a local wordline. The LxCTRL 714 activates one of the four muxL<0:3> lines 768 corresponding to the activated lmuxL line 784. This causes the LSA 712 to connect one of the four cell columns to the sense-amp amplifier core 762. The amplifier core 762 discharges one bitline in every select pair to VSS depending on the original data on the global wordlines. The LXDEC 710 corresponding to the activated global wordline activates the local wordline. The data from the local bitlines are written into the cells.

Simultaneously with writing the data from the local bitlines into the cells, the LxCTRL 714 activates the IwIRH line 794. This signal causes the LxCTRL 714 to rapidly discharge the bitR line 760. When the signal on the bitR line 760 crosses a predetermined threshold, the LXDEC 710 deactivates the local wordline. The data is now fully written to the cells. Simultaneously, the LxCTRL 714 deactivates the senseH 766 and muxL lines 768 and reactivates the genL line 780. When the wIRH line 794 is deactivated, the LxCTRL 714 precharges the bitR line 760 to prepare for the next access. When the rbankL line 788 is deactivated, the LxCTRL 714 deactivates the bnkL line to prepare for the next access. In one embodiment, bnkL provides local bank signals to the local decoder. It is contemplated that the bnkL may comprise bnkL—top and bnkL—bot as provided previously.

Burn-In Mode

Returning to FIG. 7, one embodiment of the present invention includes a burn-in processor mode for the local blocks activated by a burn in line 796 (alternatively referred to as "BIL"). This process or mode stresses the SRAM module or block to detect defects. This is enabled by simultaneously activating all the lmuxL<0:3>784, blkSeIH_bot 756, blkSeIH_top 758, and rbankL lines 788, but not the wIRH line 794 (i.e., the wIRH line 794 remains inactive). In that case, BIL 796 will be asserted, allowing the local word lines to fire in the LxDEC 710 array. Also, all the LSA muxes will open, allowing all the bitlines to decay simultaneously. Finally, since wIRH 794 is not activated, bitR 760 will not decay and the cycle will continue indefinitely until the high clock period finishes.

Local Cluster

In one embodiment, a block may be divided into several clusters. Dividing the block into clusters increases the multiplexing depth of the SRAM module and thus the memory. Although the common local wordlines runs through all clusters in a single block, only sense amps in one cluster are activated. In one embodiment, the local cluster block is a thin, low-overhead block, with an output that sinks the tail current of all the local sense-amps 712 in the same cluster. In this embodiment, the block includes global clusterL 799 and local clusterL 798 interfaces or lines (best viewed in FIG. 7).

Prior to a READ or WRITE operation, a global clusterL line 799 (alternatively referred to as "gclusterL") is activated by the external interface for all clusters that are involved in the READ/WRITE operation. The local cluster includes a gclusterL line 799 or signal on the line that is buffered and driven to clusterL 798. The clusterL line 798 connects directly to the tail current of all the local sense-amps 712 in the cluster. If the cluster is active, the sense-amps will fire, but if the cluster is inactive the sense-amps will not fire. Since the cluster driver is actually sinking the sense-amp tail current, the NMOS pull down must be very large. The number of tail currents that the cluster can support is limited by the size of the NMOS pull down and the width of the common line attached to the local sense-amp tail current.

It should be appreciated that the muxing architecture described above can be used on its own without the amplifier portion of the LSA 712 as illustrated in FIG. 2. In this embodiment, the local bitline transmission gates are used to directly connect the local bitlines to the global bitlines. The GSA's 724 performs all the functions of the local sense-amp. The area of the LSA 712 and LxCTRL 714 decrease as less functionality is required of these blocks. For small and medium scale memories, the access time may also decrease because one communication stage has been eliminated. That is the bitlines now communicate directly with the GSA 724 instead of the LSA 712. The reduced interface and timing includes the LxDEC 710 as provided previously but different LSA 712 and LxCTRL 714.

In this embodiment, the local bit lines are hierarchically portioned without the LSA. Since gbit has a lower capacitance than lbit (due to being spread apart and no diffusion load for example) such hierarchical memories are generally faster and lower power performance in comparison to simple flat memories.

In one embodiment, the cluster includes a one-dimensional array of LSA's 712 composed of four pairs of bitline multiplexers. Each bitline multiplexer may connect a corresponding bitline pair to the global bitline through a full transmission gate. When a bitline pair is disconnected from the global bitline, the bitline multiplexer actively equalizes and precharges the bitline pair to VDD. Because there are four times fewer global bitlines than local bitlines, the global bitlines are physically wider and placed on a larger pitch. Again, this significantly reduces the resistance and capacitance of the long global bitlines, increasing the speed and reliability of the memory.

The LSA 712 is controlled by the muxL and lwIH signals shared across the entire LSA 712 array. The muxL<0:3> line 768 selects which of the four pairs of local bitlines to use on the current access. Any local bitline not selected for access is always maintained in a precharged and equalized state by the LSA 712. In one example, the local bitlines are precharged to VDD.

The IwIRH line 794 line represents a dummy poly line that replicates the poly local wordline that runs through each row of the block. The IwIRH line 794 forms the gate of dummy transistors that terminate each column of the cell array. Each dummy transistor replicates the access transistor of the 6T SRAM cell.

In a global cluster mode, each block has a single local controller that coordinates the activities of the local x-decoders and multiplexers by exercising the bitR 760, bnkL, muxL 768, and IwIRH 782 control signals. Each of these signals is activated by a driver and control logic circuit in the LxCTRL circuit 714. All these signals are normally inactive when the memory is in the idle state. The LxCTRL circuit 714 is in turn activated by Vertical and Horizontal signals.

The Vertical signals are these signals shared by all LxCTRL 714 circuits in the same column block, including the lmuxL 784, rbnkL 788, rgbitR 760, gbitR 760 and wbnkL 792 lines or signals on the line. Only one of the four signals lmuxL <0:3> lines 784 is active at any time. The active line selects one of four cell array columns interfaced to each LSA 712 for access. The rbnkL line 788 is activated when a READ operation is requested from the block. At the end of the READ operation, all global bitlines that are not actively precharged by the GSA 724 containing limited swing differential signals representing the stored values in the cells selected by the wIH line and the lmuxL signals.

The rgbitR line 760 is externally maintained at VDD when the memory is idle and is made floating when a read access is initiated. The LxCTRL 714 block connects this line to bitR 760 and discharges this signal line to VSS when a READ access in concluded.

The wgbitR line 760 is externally maintained at VDD when the memory is idle and is discharged during a write access. The LxCTRL 714 block connects this line to bitR 760, and relies on the signal arriving at VSS to process a WRITE operation.

The wbnkL line 792 is activated when a WRITE operation is requested from the block. Full swing differential signals representing the data to be written are present on the global bitlines when this line is activated.

All LxCTRL 714 circuits in the same row block share Horizontal signals. The wIRH line 794 is a replica of the global wordline wIH that runs through each row of the memory. The physical layout of the line with respect to metal layer, width, and spacing, replicates the global wordline in each row, so as to make the capacitive loading the same. This line is activated simultaneously with a single global wordline for one row in the block on every memory access. The blkSelH line is active on every memory access to the block and indicates that the transmission gate should be opened.

Figure 22A:
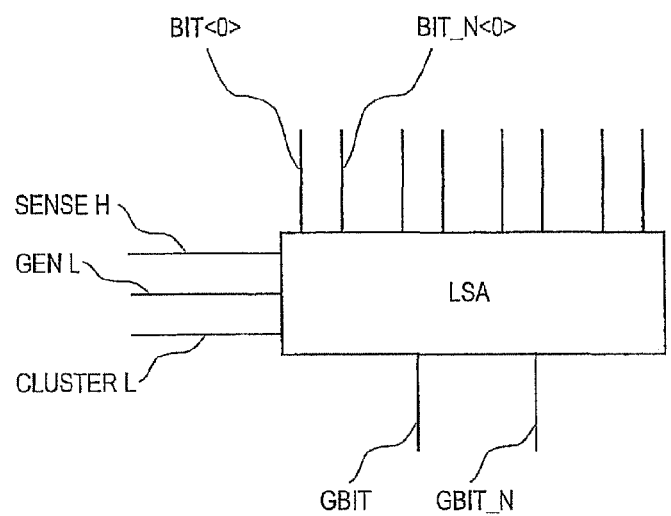
FIG. 22A illustrates a block diagram of local sense amp having 4:1 local muxing and precharging incorporated therein in accordance with one embodiment of the present invention.
Figure 22B:
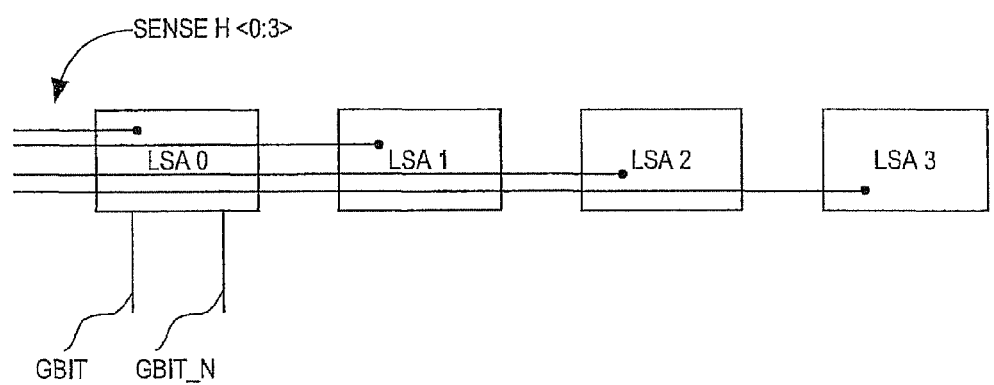
FIG. 22B illustrates one example of 16:1 muxing (including 4:1 global muxing and 4:1 local muxing) in accordance with one embodiment of the present invention.
Figure 22C:
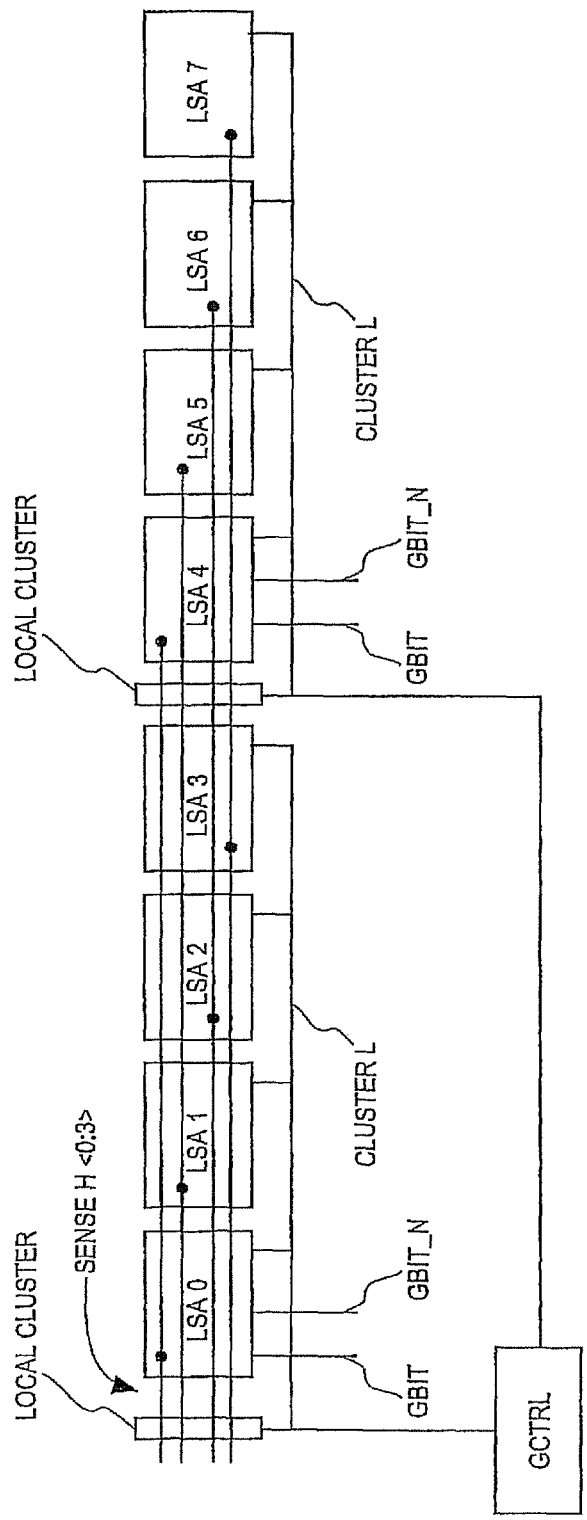
FIG. 22C illustrates one example of 32:1 muxing (including 8:1 global muxing and 4:1 local muxing) in accordance with one embodiment of the present invention.
Figure 23:
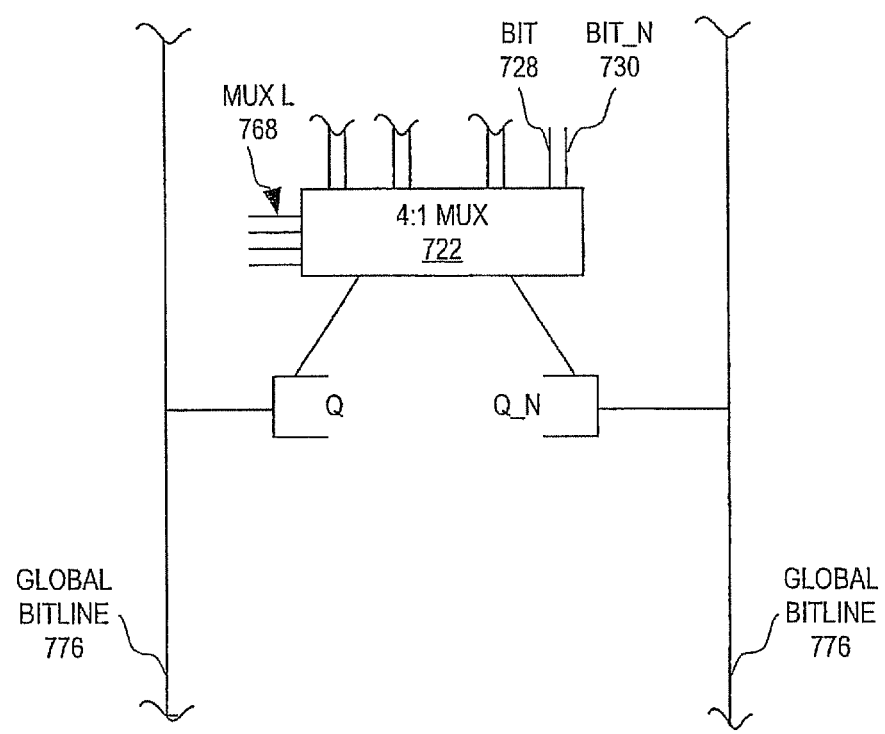
FIG. 23 illustrates a local sense amp used with a cluster circuit in accordance with one embodiment of the present invention.

FIGS. 22A, 22B and 22C illustrate different global and muxing arrangements. FIG. 22A illustrates one embodiment of a local sense amp including 4:1 muxing and precharge and equalizing. The LSA is represented here as a single device having four bit/bit_n pairs; one SenseH line, one GenL line, one clusterL line and one gbit/gbit_n pair coupled thereto. FIG. 22 illustrates one example of 4:1 muxing (alternatively referred to as 4:1 local muxing) built into the LSA. In one embodiment, each LSA is coupled to 4 bit/bit_n pairs. During a READ/WRITE operation, one bitline pair of the four possible bitline pairs coupled to each LSA is selected. However, embodiments are contemplated in which the clusters are used without dropping the LSA's (i.e., the clusters are used with the LSA's).

FIG. 22B illustrates one embodiment of the present invention including 16:1 muxing. Again, each LSA is coupled to 4 bitline pairs (the 4:1 local muxing provided previously). Here, four SenseH lines <0:3> are illustrated coupled to the LSA's where one SenseH line is coupled to one LSA. This is referred to as 16:1 muxing comprising 4:1 global muxing due to the SenseH lines and 4:1 local muxing. When one of the SenseH line fires, one of the four LSA's is activated, enabling one of the four bitline pairs coupled to the activated LSA to be selected. In other words, this combination enables at least one bitline pair to be selected from the 16 total bitline pairs available.

FIG. 22C illustrates one embodiment of the present invention including 32:1 muxing. Again, each LSA is coupled to 4 bitline pairs (the 4:1 local muxing provided previously). Here, four SenseH lines <0:3> are illustrated coupled to the LSA's where one SenseH line is coupled to two LSA. For example, one SenseH line is coupled to LSA 0 and 4, one SenseH line is coupled to LSA 1 and 4, etc. This embodiment includes two local cluster devices, where the first local cluster device is coupled to LSA's 1-3 via a first ClusterL line while the second local cluster device is coupled to LSA's 4-7 via a second ClusterL line. When ClusterL is low, the associated LSA's fire.

The cluster devices are also illustrated coupled to the SenseH lines <0:3> and the GCTRL. GCTRL activates one or more local cluster devices, which in turn fires the associated ClusterL line. If the associated SenseH line fires, then the LSA is active and one bitline pair is selected. For example, if the GCTRL activates the first cluster device, then the first ClusterL line fires (i.e., ClusterL is Low). If SenseH <0> also fires, then LSA 0 is active and one of the four bitline pairs coupled to LSA 0 is selected. In other words, this combination enables at least one bitline pair to be selected from the 32 total bitline pairs available.

While only 4:1, 16:1 and 32:1 muxing are illustrated, any muxing arrangement is contemplated (i.e., 8:1, 64:1, 128:1, etc.) Further, while only two cluster devices and two ClusterL lines are illustrated, any number or arrangement is contemplated. For example, the number of cluster devices and cluster lines may vary depending on the number of local blocks in the memory architecture or the muxing requirements. Flexible, partially and more choices for a given memory request.

Synchronous Global Contoller with Enhanced Pipelining

Memory architectures process a plurality of read and write operations. In one embodiment of the present invention, such read and write operations should be completed in a single internal cycle the internal cycle of the memory architecture for example In one embodiment of a memory system or structure, having DSPM dual port memories for example, the single internal cycle may be faster than the external clock (i.e., the internal clock pulse or cycle is made faster using pulse generation circuits or DLL circuits). The global controller generally provides control signals as well as managing the timing of the read or write processes.

Figure 24:
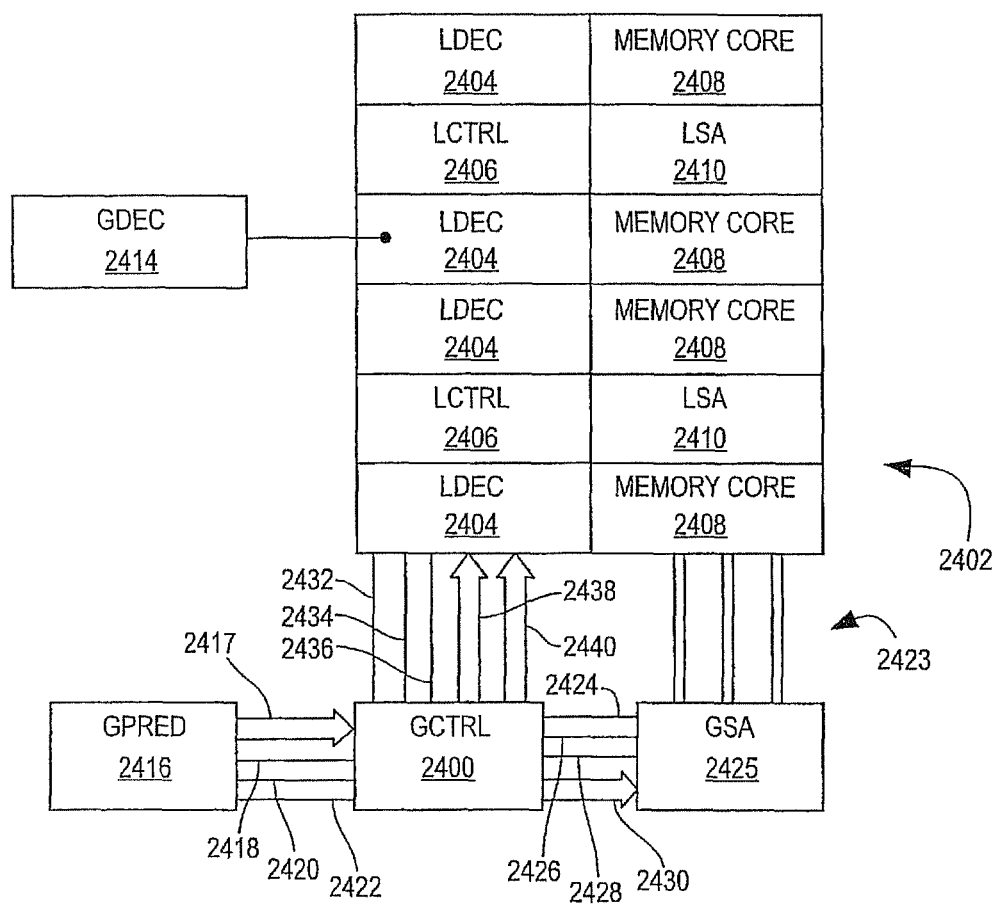
FIG. 24 illustrates a block diagram of a memory device having a synchronously controlled global controller in accordance with one embodiment of the present invention.
Figure 25A:
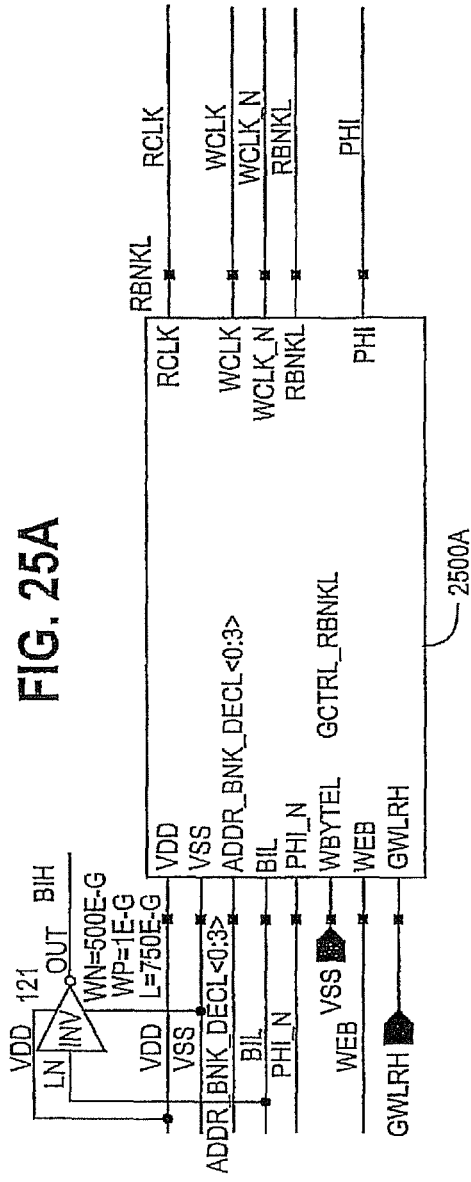
FIGS. 25A-E illustrate a plurality of interconnections for the synchronously controlled global controller in accordance with one embodiment of the present invention.
Figure 25B:
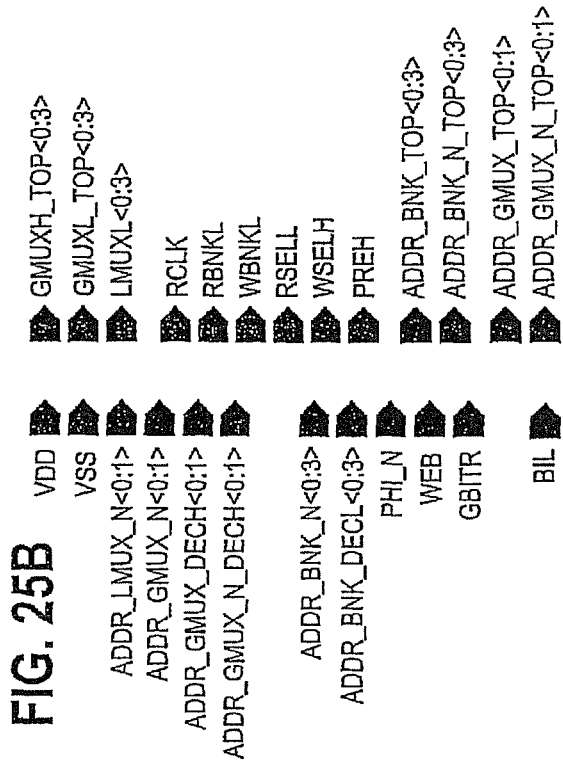
Figure 25C:
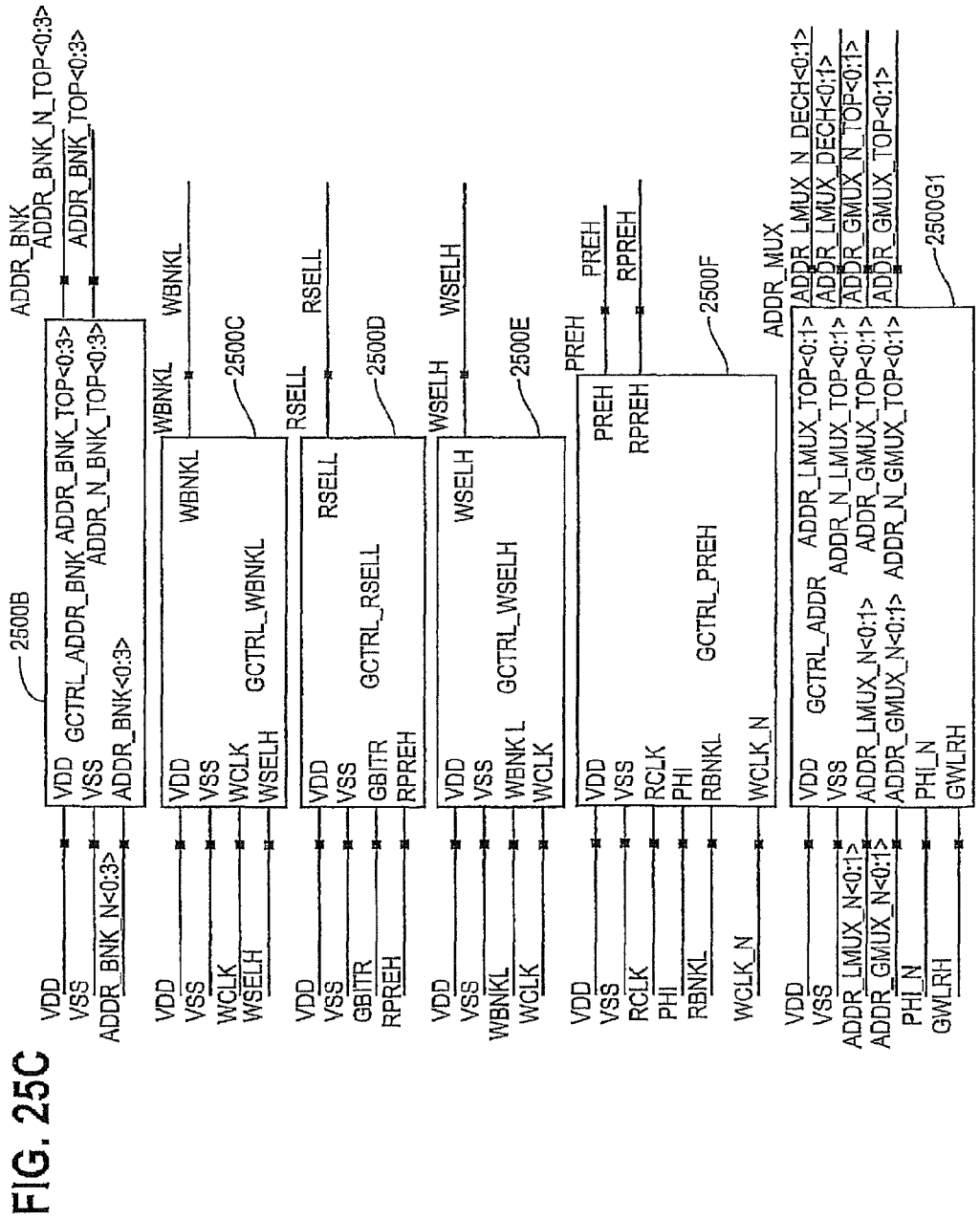
Figure 25D:
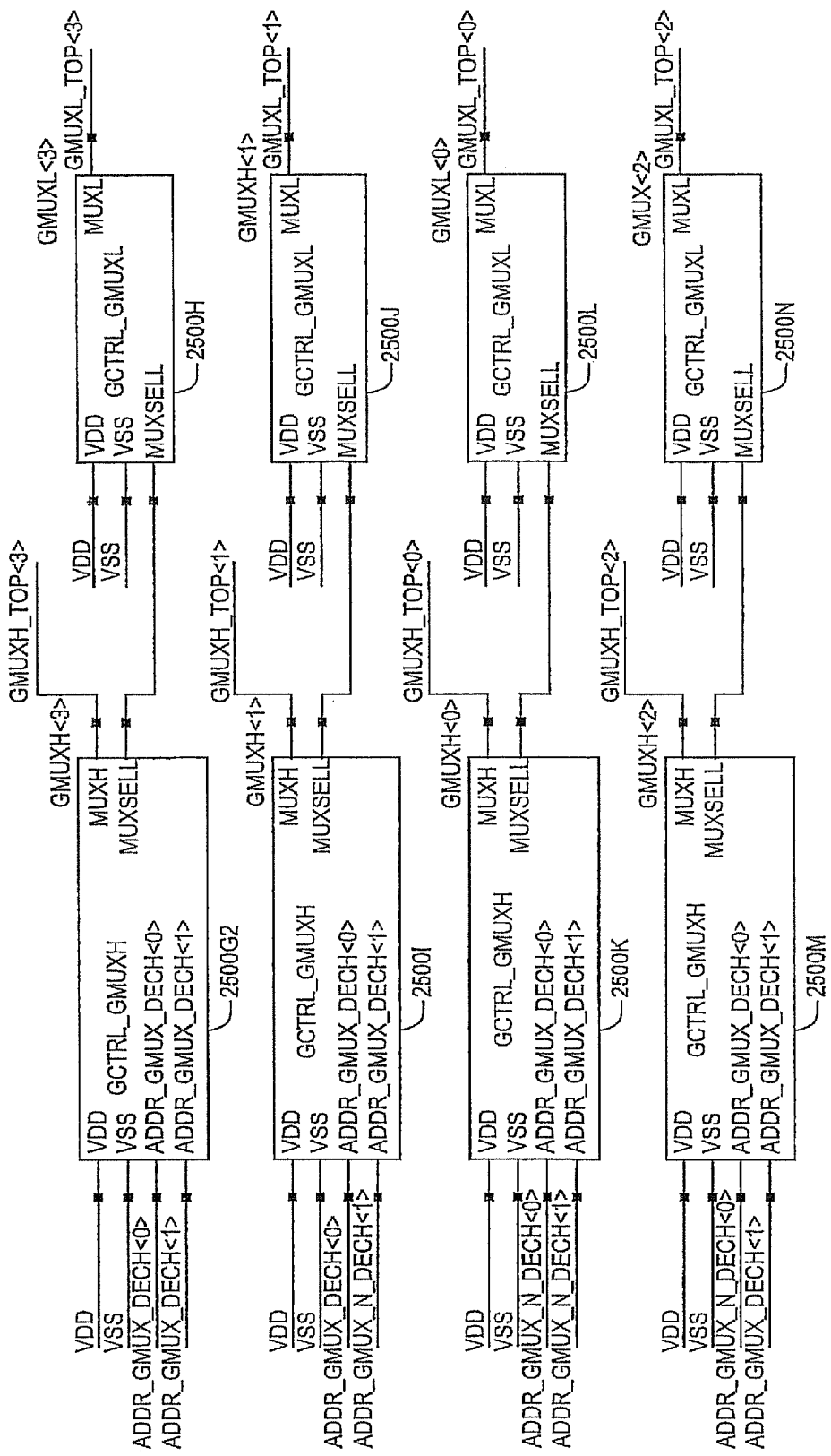
Figure 25E:
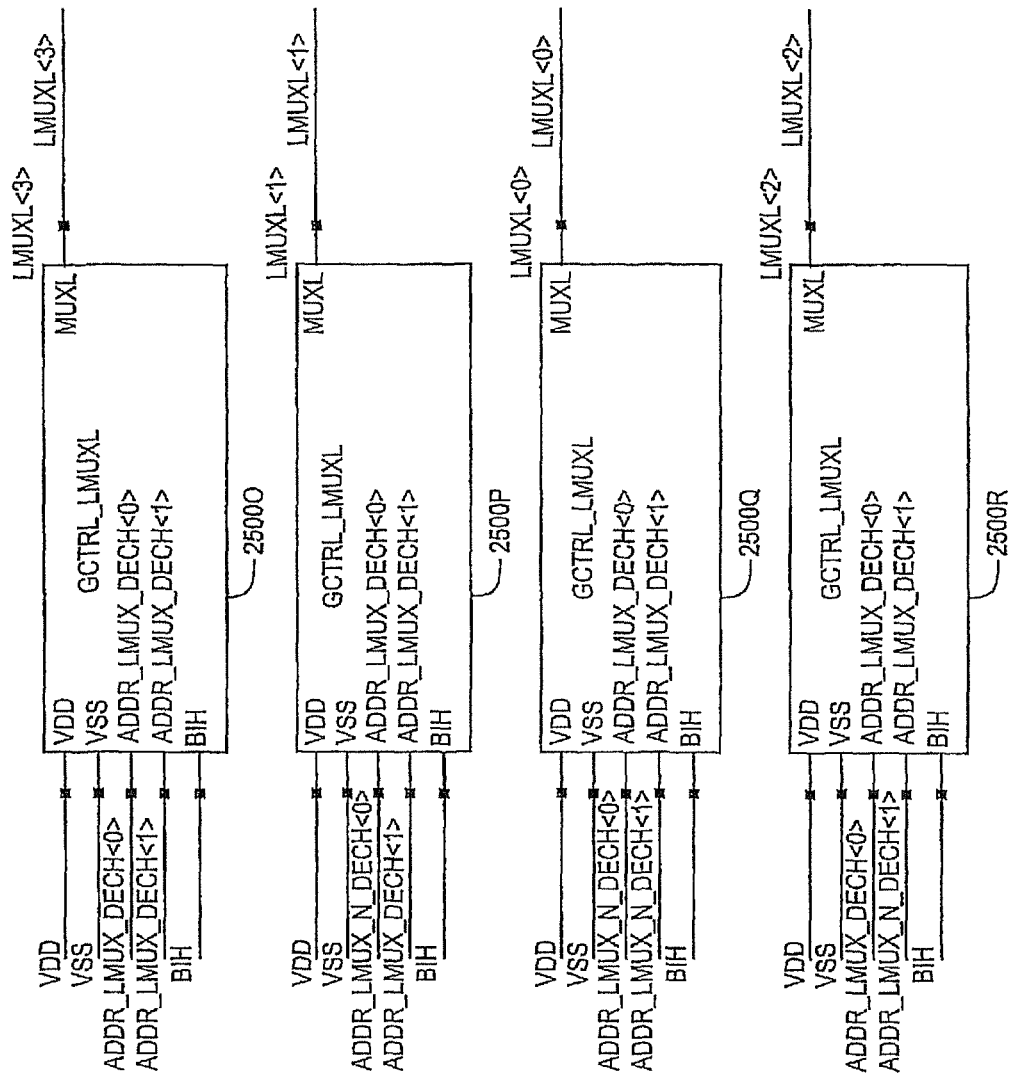

FIG. 24 illustrates one embodiment of a memory storage device comprising at least a synchronously controlled global controller 2400 coupled to a local block 2402 similar to the local blocks provided previously. In the illustrated embodiment, global controller 2400 uses one or more lines to communicate or interface with the local memory block 2402 (comprising one or more local decoders 2404, local controllers 2406, memory cores 2408 and local sense amps 2410), a global predecoder 2412 and a GSA 2425. While four local decoders, two local controllers, four memory cores and two local sense amps are illustrated, different combinations and arrangements are contemplated. A global decoder 2414 is illustrated coupled to at least one local decoder 2404 of the local memory block 2402 (alternatively referred to as the "local block").

A plurality of lines is illustrated coupled to the global controller 2400 (alternatively referred to as "GCTRL") as provided previously. In the illustrated embodiment, a plurality of address lines 2417, a write enable bar (alternatively referred to as a "web") line 2418, a clock line 2420 and a word line high replica (alternatively referred to as "wlHR") line 2422 are illustrated coupling global predecoder 2416 to the GCTRL 2400, such that the global predecoder and the GCTRL may communicate.

When the signal on web 2418 is low at an edge of a clock pulse, a write cycle is initiated. That is GCTRL 2400 generates the control signals and manages the timing for a write operation. Alternatively, when the signal on web line 2418 is high, a read cycle is initiated. That is, in one embodiment, the GCTRL 2400 generates the control signals and manages the timing for a read operation. In one embodiment of the present invention, the GCTRL 2400 further includes a phi_n signal, which is the inverted system clock input for One Port memories or two times the clock pulse for double-pumped Two Port Memories.

FIG. 24 further illustrates a number of lines coupling the GCTRL 2400 to the GSA 2425 including a precharge high ("preH") line 2424, a rselH line 2426, a wselH line 2428 and a plurality of gmux lines 2430. Pluralities of gbit lines 2423 are illustrated interfacing with the GSA 2425, enabling the GSA 2425 to communicate with the local block 2402. In one embodiment of the present invention, when the signal on the rselH line 2426 is high, the global sense amp 2424 fires.

The GCTRL 2400 also includes a plurality of lines coupled to or interfacing with local block 2402 as illustrated. Such lines include a rbnkL line 2432, a wbnkL line 2434, a global bit replica ("gbitR") line 2436, a plurality of local mux ("lmux <0:3>") lines 2438 and a plurality of global mux ("gmux <0:3>") lines 2440. In one embodiment of the present invention, the GCTRL 2400 takes at least one address and generates at least one signal on at least one of the local MUX lines 2438 synchronous with the clock pulse.

FIGS. 25A-E illustrate the various interconnections to or interfaces with the synchronously controlled controllers 2500A-2500R (similar to the global controllers provided previously) in accordance with one embodiment of the present invention. GCTRL_rbankI 2500A illustrates the interconnections between the global controller and at least the rbankL line, while GCTRL_addr_bnk 2500B illustrates the various interconnections between the global controller and the plurality of addr_bnk_lines. GCTRL_wbankI 2500C illustrates the various interconnections between the global controller and the wbankL line, and GCTRL rselL 2500D illustrates the interconnections between the global controller and the rselL line. Likewise GTRL_wselH 2500E illustrates the interconnections between the global controller and the wselH line and GCTRL_preH 2500F illustrates the interconnections between the global controller and the preH line.

GCTRL 2500G1 illustrate the interconnections between the global controller and the addr_lmux and addr_gmux lines. Similarly, GCTRL_gmuxH 2500G2, 2500I, 2500K, 2500M and GCTRL_gmuxL 2500H, 2500J, 2500L, and 2500N illustrate the interconnections between the global controller and the muxH, muxL and muxselL lines. GCTRL_lmuxL 25OO0, 2500P, 2500Q and 2500R illustrate the interconnections between the global controller and the plurality of lmuxL lines.

Figure 26:
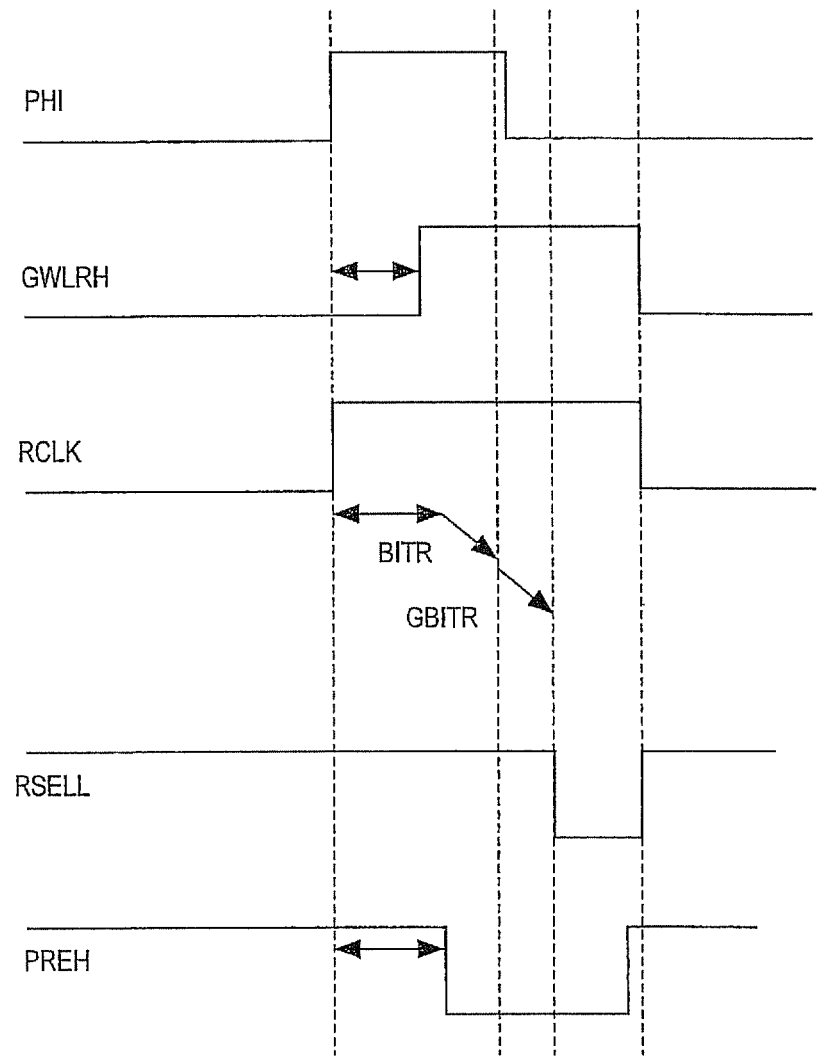
FIG. 26 illustrates a general timing diagram for a write cycle in accordance with one embodiment of the present invention.

One embodiment of a timing cycle for a read operation is illustrated in FIG. 26. The rbnkL signal fires low as soon as possible after clock signal is received. The rbnkL signal is transmitted to the local controller in order to start the read cycle. This signal turns off the pre-chargers for gbitR and the gbit lines where gbitR is a replica of the gbit lines as provided previously.

The local sense amps decay the gbit lines, in one embodiment, after data is sensed locally. When the local sense-amps start decaying the gbit lines, the local controller starts decaying gbitR at the same time but at a much rate. In one embodiment gbitR decays five times faster than gbit for example. When gbitR decays to a predetermined value, about Vdd/2 for example, gbit has decayed a sufficient amount and the associated local sense-amps turn off. When the sense amps turn off, the global sense-amps turn on. A signal is generated on rselL (which is an inverted version of rselH) by buffering gbitR, turning on the global sense-amp. The data is ready to be read by the I/O pieces. Pre-chargers are turned on, precharging gbitR and gbit lines for the next cycle.

Figure 27:
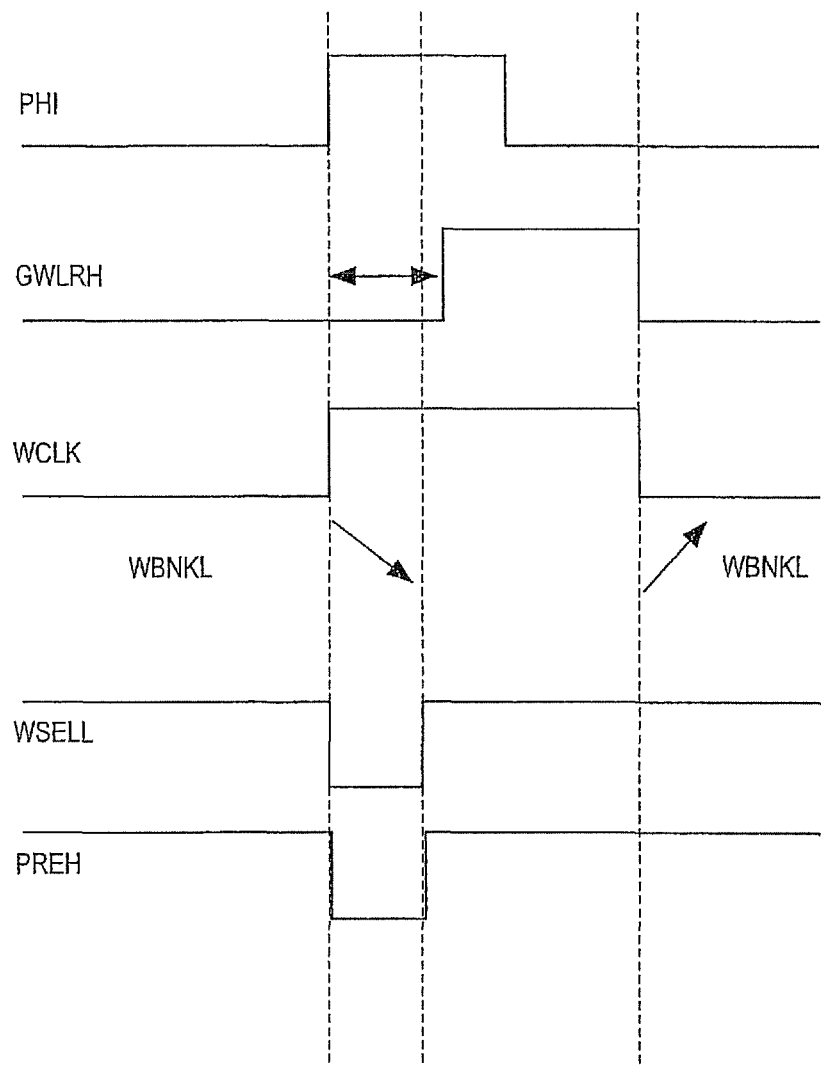
FIG. 27 illustrates a timing diagram for a read cycle in accordance with one embodiment of the present invention.
Figure 28:
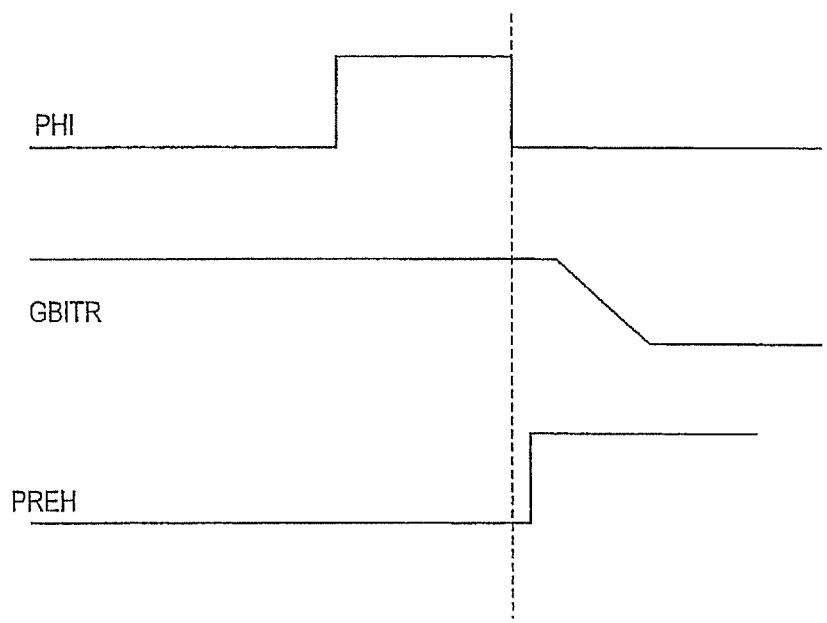
FIG. 28 illustrates a timing diagram for a write cycle having an extended clock pulse in accordance with one embodiment of the present invention.
Figure 29:
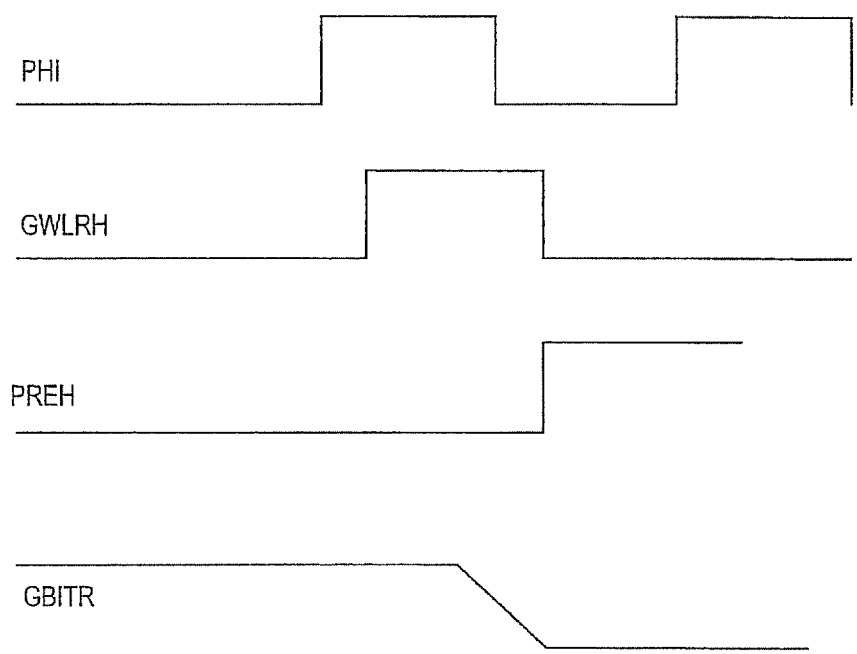
FIG. 29 illustrates a timing diagram for a read cycle having an extended clock pulse in accordance with one embodiment of the present invention.

One embodiment of a timing cycle for a write operation is illustrated in FIG. 27. In this embodiment, the wselH signal fires as soon as possible after the clock pulse is received by the GCTRL. The wselH signal fires the global sense-amp, enabling the GSA to decay the gbits lines. GCTRL starts decaying the wbnkL line at the same time as GSA starts decaying the gbits line, but faster. In one embodiment, the wbnkL decays five times faster for example. When the signal on the wbnkL line reaches a predetermined value, Vdd/2 for example, the gbits signal base has decayed sufficiently. The signal on the wselH line is turned off. The local blocks start reading data from the gbit lines. After a sufficient amount of time, the pre-chargers start pre-charging, enabling the local blocks to write data to the memory cells.

In one embodiment, it is contemplated that if all the signals are to be pre-charged properly at the falling edge of the clock pulse, a certain amount of time is needed to complete a read or write operation. After the read or write operation is complete, additional time is needed to recharge the signals. The minimum cycle time may be achieved if pre-charging starts right after completion of the read or write operation. However, signals are used to indicate the completion of the read or write operation. Subsequently, in known systems, the pre-chargers fire at the falling edge of a clock pulse, so that the write or read operations are completed in the first half of the cycle when the clock pulse is high. In other words the clock pulse remains high long enough for the read and write operations to be completed. In the second half of the cycle (i.e., when clock pulse is low,) the pre-chargers pre-charge.

In one embodiment of the present invention, the clock is skewed to achieve the best ratio of operation time to pre-charge time. In other words, the high portion of the clock is extended. The GCTRL uses the gwlRH signal to extend the high portion of the clock pulse. The gwlRH signal is a replica of gwlH signal used to activate a specific local block 2402. In one embodiment, gwlH mimics the time a local block takes to become activated by replicating the associated predecoded and global decoder delays. It should be apparent that there is no point for GCTRL to extend the clock further than the falling edge of gwlH.

GCTRL generates two different clocks pulses for read and write operations. In each cycle, depending on the web signal (indicating a read or write mode), one of these two clocks fires with the rising edge of the clock pulse (i.e., falling edge of phi_n pulse) and a bank is selected. After the reference clock (i.e., phi_n) falls or goes away, the gwlRH keeps or maintains the value of the read/write clocks. In one embodiment, the local clock at GCTRL is a combination of phi_n and gwlRH (or combining the two via a logic or).

In one embodiment of the present invention, GCTRL extends the clock pulse. However, there generally is not sufficient time, in very fast memory structures, to accomplish pre-charging. More specifically there is not enough time to accomplish pre-charging for signals, gbit and gbit R lines for example, which are used in read operations. However, the precharges are used until the very end of the read operation. That is when the specific local block is already reading the data from the memory cells and is ready to put that data onto the global lines. By skewing the pre-charge signals for a read operation, GCTRL takes advantage of continuing the pre-charge while the local block is busy reading data from the cells. GCTRL turns on the read pre-chargers with the falling edge of the read clock pulse. However, GCTRL does not turn the prechargers off until after a certain delay following the rising edge of a read clock pulse.

The pre-charge signal reaches gbit lines after an RC delay. As the gbitR line is a replica for the gbit lines, but shares timing with WIH line, the GCTRL provides an inverter chain delaying a pre-charging signal on the gbitR line.

In a write operation in accordance with one embodiment of the present invention, the gbit lines are used in the beginning of the cycle (i.e., while the global sense-amps are putting the data onto the gbit lines). At the same time GCTRL pulls down the wbnkL line, letting the local block know that the data is ready on the gbit lines. Since local sense-amps read data from the gbit lines, such sense amps are not used until the end of the write cycle. GCTRL uses the delayed version of the wbnkL signal to turn on the pre-chargers sooner than the falling edge of the write clock pulse. This pre-charging scheme improves cycle time for the write operation.

In one embodiment, the pre-decoder block only provides mux addresses during the high portion of reference clock (i.e., phi pulse). However, since GCTRL extends the operation time, these addresses need to latch with the extended clock pulse as well. If the mux signals are not latched with the extended clock pulse, the mux signals might change when the phi signal falls or goes away. In other words, the mux signals may charge in the middle of a read or write operation, and might corrupt data. In order to enable the burn-in mode, a few transistors are added in GCTRL block.

In one embodiment of the present invention a dynamic bank decoder circuit in GCTRL provides the bnkH signal. The bnkH signal activates the selected bank in bank selectable memories. By adding one or more transistor in that circuit so that all banks are activated in a burn-in mode, GCTRL provides the local mux signals for the local block adding one or more transistors (up to four transistors are contemplated) added there to fire all local mux signals at the same time during burn in mode.

Many modifications and variations of the present invention are possible in light of the above teachings. Thus, it is to be understood that, within the scope of the appended claims, the invention may be practiced otherwise than as described hereinabove.

What is claimed is:

1. A system comprising:
 a memory block; and
 a controller in communication with the memory block, the controller adapted to skew a pre-charge signal for a bit line of the memory block.

2. The system of claim 1, where the controller is adapted to skew the pre-charge signal for performing a read operation of the memory block.

3. The system of claim 1, where the controller is adapted to skew the pre-charge signal for performing a write operation of the memory block.

4. The system of claim 1, further comprising:
 a sense amplifier in communication with the bit line of the memory block, the sense amplifier adapted to:
  automatically shut off after indicating a sensed data state for the bit line.

5. The system of claim 4, where the sense amplifier comprises a self-latching sense amplifier.

6. The system of claim 4, where the controller is adapted to precharge the bit line in response to the sense amplifier shutting off.

7. The system of claim 1, where the controller is adapted to keep the bit line precharged when the bit line is not selected during a memory access.

8. The system of claim 1, where the controller comprises a global controller.

9. The system of claim 1, where the controller comprises a local controller.

10. The system of claim 9, where the local controller comprises an asynchronously controlled local controller.

11. The system of claim 1, where the controller comprises a local controller adapted to receive a timing signal from a global controller that is in communication with other local controllers.

12. A method comprising:
through a controller in communication with a memory block:
skewing a pre-charge signal for a bit line of the memory block.

13. The method of claim 12, where skewing comprises:
skewing the pre-charge signal for a read operation of the memory block.

14. The method of claim 12, where skewing comprises:
skewing the pre-charge signal for a write operation of the memory block.

15. The method of claim 12, further comprising:
automatically shutting off a sense amplifier in communication with the bit line after indicating a sensed data state for the bit line.

16. The method of claim 15, where skewing the pre-charge signal comprises precharging the bit line in response to the sense amplifier shutting off.

17. The method of claim 12, where skewing the pre-charge signal comprises:
skewing the pre-charge signal through asynchronous logic.

18. The method of claim 12, where skewing the pre-charge signal comprises:
skewing the pre-charge signal through synchronous logic.

19. A system comprising:
a first controller in communication with a first memory block that comprises a first pre-charge signal; and
a second controller in communication with a second memory block that comprises a second pre-charge signal;
where the first and second controllers are adapted to independently skew the first and second pre-charge signals.

20. The system of claim 19, further comprising:
a global controller in communication with the first and second controllers; and
where the first and second controllers each comprise a local controller that is adapted to receive a timing signal from the global controller.

* * * * *

UNITED STATES PATENT AND TRADEMARK OFFICE
CERTIFICATE OF CORRECTION

PATENT NO. : 8,693,279 B2  
APPLICATION NO. : 13/769757  
DATED : April 8, 2014  
INVENTOR(S) : Ali Anvar et al.

Page 1 of 1

It is certified that error appears in the above-identified patent and that said Letters Patent is hereby corrected as shown below:

On the Title Page

Left column, item (63), line 8, under "Related U.S. Application Data", after "now Pat. No. 7,260,020," insert --which is a continuation of application No. 10/177,311, filed on Jun. 21, 2002, now Patent No. 6,928,026,--.

Left column, item (63), line 9, under "Related U.S. Application Data", after "continuation-in-part of application No." replace "10/100,758," with --10/100,757,--.

In the Specification

In column 1, line 19, after "issued as U.S. Pat. No. 7,260,020," insert --which is a continuation of U.S. application Ser. No. 10/177,311, filed Jun. 21, 2002, titled "Synchronous Global Controller For Enhanced Pipelining", and issued as U.S. Pat. No. 6,928,026,--.

Signed and Sealed this  
Ninth Day of December, 2014

Michelle K. Lee  
*Deputy Director of the United States Patent and Trademark Office*